(12) United States Patent
Tsuchi

(10) Patent No.: US 8,111,184 B2
(45) Date of Patent: Feb. 7, 2012

(54) DIGITAL-TO-ANALOG CONVERTING CIRCUIT, DATA DRIVER AND DISPLAY DEVICE

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 539 days.

(21) Appl. No.: 12/320,831

(22) Filed: Feb. 5, 2009

(65) Prior Publication Data
US 2009/0213051 A1 Aug. 27, 2009

(30) Foreign Application Priority Data

Feb. 7, 2008 (JP) .................................. 2008-028020
Jan. 28, 2009 (JP) .................................. 2009-016225

(51) Int. Cl.
*H03M 1/68* (2006.01)
(52) U.S. Cl. ......................... 341/145; 341/144; 345/692
(58) Field of Classification Search .................. 341/144, 341/145; 345/94, 690–693
See application file for complete search history.

(56) References Cited

U.S. PATENT DOCUMENTS

| | | | |
|---|---|---|---|
| 6,373,419 B1 | 4/2002 | Nakao | |
| 6,535,189 B1 | 3/2003 | Akiyama et al. | |
| 7,126,518 B2 * | 10/2006 | Tsuchi ........................... | 341/144 |
| 7,209,057 B2 * | 4/2007 | Hashido et al. ................ | 341/144 |
| 7,368,990 B2 | 5/2008 | Tsuchi | |
| 7,369,075 B2 | 5/2008 | Ishii et al. | |
| 7,812,752 B2 * | 10/2010 | Tsuchi et al. ................. | 341/144 |
| 2005/0088329 A1 * | 4/2005 | Tsuchi .......................... | 341/144 |
| 2006/0132344 A1 * | 6/2006 | Ishii et al. ...................... | 341/144 |

FOREIGN PATENT DOCUMENTS

| | | |
|---|---|---|
| JP | 2000-183747 | 6/2000 |
| JP | 2001-34234 | 2/2001 |
| JP | 2006-174180 | 6/2006 |
| JP | 2006-197532 | 7/2006 |

OTHER PUBLICATIONS

Japanese Office Action dated Dec. 8, 2009 and a partial English translation thereof.

* cited by examiner

*Primary Examiner* — Howard Williams
(74) *Attorney, Agent, or Firm* — McGinn IP Law Group, PLLC

(57) ABSTRACT

A m-bit DAC outputs a voltage that is the result of interpolation from two reference voltages. The two reference voltages are selected, inclusive of redundant selection of the same reference voltage (inclusive also of reference voltages other than adjacent voltages) out of a plurality of reference voltages. The plurality of reference voltages are grouped into first to (3S+1)th groups (where S is a power of 2). An ith group includes [3S(j−1)+i]th reference voltages (where j=1, 2, . . . h, and h is a prescribed integer). The decoder includes (3S+1)th subdecoders, each selecting one voltage responsive to a first MSB group; and a (3S+1)-input and 2-output subdecoder for selecting two voltages, inclusive of redundant selection of the same reference voltage, out of (3S+1) voltages selected by the respective first to (3S+1)th subdecoders, responsive to a LSB group and outputs them to an interpolation amplifier (ratio 1:1).

23 Claims, 32 Drawing Sheets

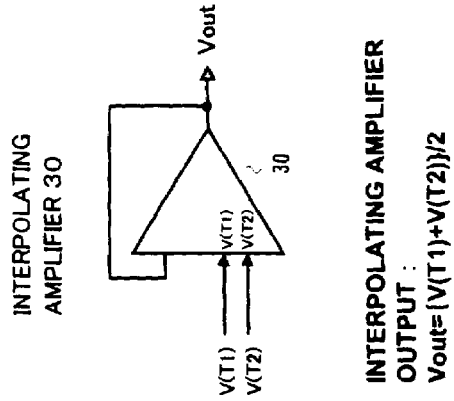
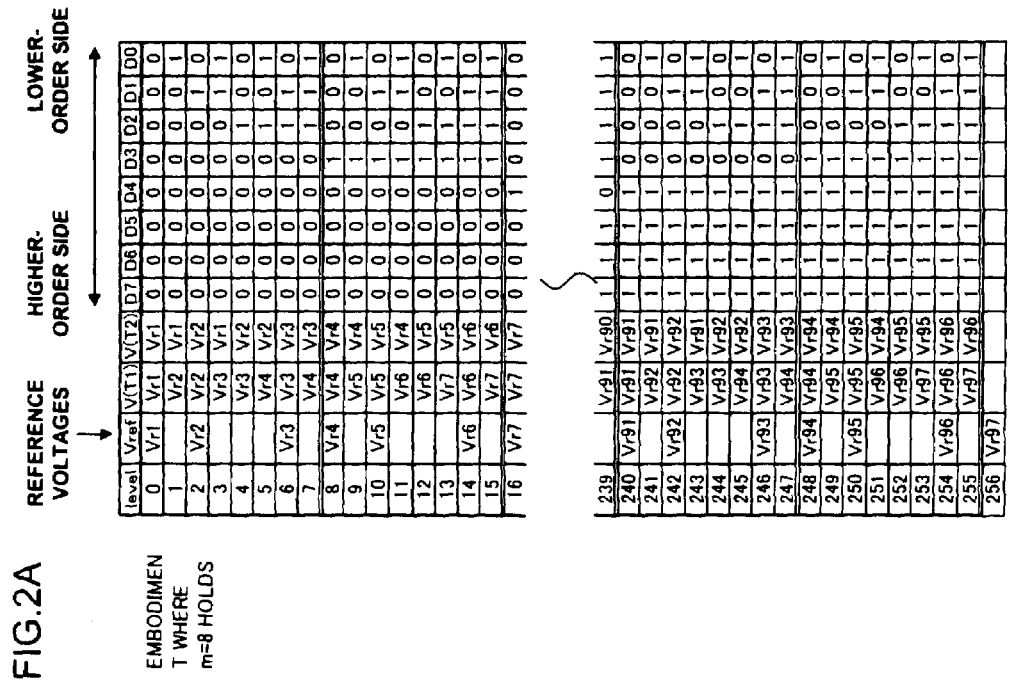

FIG.9

| | | FIG.3<br>(S=2,m=8,n=4)<br>8 BITS | (S=2,m=10,n=4)<br>10 BITS | FIG.7<br>(S=1,m=8,n=3)<br>8 BITS | (S=1,m=10,n=3)<br>10 BITS |
|---|---|---|---|---|---|
| SUBDECODER 13 | SUBDECODER 15 | 18 | 18 | 18 | 18 |
| | SUBDECODER 14 | 8 | 8 | 0 | 0 |
| SUBDECODER 11 | | 210 | 882 | 248 | 1016 |
| TOTAL | | 236 | 908 | 266 | 1034 |

FIG.20A  PRIOR ART

| DECODER 802 | 6 BITS | 8 BITS | 10 BITS |
|---|---|---|---|
| TOTAL | 74 | 270 | 1042 |

FIG.20B  PRIOR ART

| 1st DECODER | | 8 BITS | 10 BITS |
|---|---|---|---|
| | TOURNAMENT 1, 2 | 126 | 510 |
| | TOURNAMENT 3 | 62 | 254 |
| 2nd DECODER | | 12 | 12 |
| TOTAL | | 326 | 1286 |

FIG.22    PRIOR ART

| LEVEL | LEVEL | (T1,T2) | (D2,D1,D0) |
|---|---|---|---|
| 1 | A | AA | 0,0,0 |
| 2 |   | AB | 0,0,1 |
| 3 | B | BB | 0,1,0 |
| 4 |   | AC | 0,1,1 |
| 5 |   | BC(AD) | 1,0,0 |
| 6 |   | BD | 1,0,1 |
| 7 | C | CC | 1,1,0 |
| 8 |   | CD | 1,1,1 |
| 9 | D | DD |   |

※T1, T2 ARE IN NO PARTICULAR ORDER

FIG.25
EMBODIMENT WHERE m=8 HOLDS

REFERENCE VOLTAGES →

HIGHER-ORDER SIDE ↕ LOWER-ORDER SIDE

| level | Vref | V(T1) | V(T2) | D7 | D6 | D5 | D4 | D3 | D2 | D1 | D0 |
|---|---|---|---|---|---|---|---|---|---|---|---|
| 0 | Vr1 | Vr1 | Vr1 | 0 | 0 | 0 | 0 | 0 | 0 | 0 | 0 |
| 1 |  | Vr2 | Vr1 | 0 | 0 | 0 | 0 | 0 | 0 | 0 | 1 |
| 2 | Vr2 | Vr2 | Vr2 | 0 | 0 | 0 | 0 | 0 | 0 | 1 | 0 |
| 3 |  | Vr3 | Vr2 | 0 | 0 | 0 | 0 | 0 | 0 | 1 | 1 |
| 4 |  | Vr3 | Vr3 | 0 | 0 | 0 | 0 | 0 | 1 | 0 | 0 |
| 5 | Vr3 | Vr4 | Vr3 | 0 | 0 | 0 | 0 | 0 | 1 | 0 | 1 |
| 6 |  | Vr4 | Vr4 | 0 | 0 | 0 | 0 | 0 | 1 | 1 | 0 |
| 7 | Vr4 | Vr4 | Vr4 | 0 | 0 | 0 | 0 | 0 | 1 | 1 | 1 |
| 8 |  | Vr5 | Vr4 | 0 | 0 | 0 | 0 | 1 | 0 | 0 | 0 |
| 9 | Vr5 | Vr5 | Vr5 | 0 | 0 | 0 | 0 | 1 | 0 | 0 | 1 |
| 10 |  | Vr6 | Vr5 | 0 | 0 | 0 | 0 | 1 | 0 | 1 | 0 |
| 11 |  | Vr6 | Vr6 | 0 | 0 | 0 | 0 | 1 | 0 | 1 | 1 |
| 12 |  | Vr7 | Vr6 | 0 | 0 | 0 | 0 | 1 | 1 | 0 | 0 |
| 13 | Vr6 | Vr7 | Vr6 | 0 | 0 | 0 | 0 | 1 | 1 | 0 | 1 |
| 14 |  | Vr7 | Vr7 | 0 | 0 | 0 | 0 | 1 | 1 | 1 | 0 |
| 15 | Vr7 | Vr7 | Vr7 | 0 | 0 | 0 | 0 | 1 | 1 | 1 | 1 |
| 16 |  | Vr8 | Vr7 | 0 | 0 | 0 | 1 | 0 | 0 | 0 | 0 |
| ... | | | | | | | | | | | |
| 239 | Vr91 | Vr91 | Vr91 | 1 | 1 | 1 | 0 | 1 | 1 | 1 | 1 |
| 240 |  | Vr92 | Vr91 | 1 | 1 | 1 | 1 | 0 | 0 | 0 | 0 |
| 241 | Vr92 | Vr92 | Vr92 | 1 | 1 | 1 | 1 | 0 | 0 | 0 | 1 |
| 242 |  | Vr93 | Vr92 | 1 | 1 | 1 | 1 | 0 | 0 | 1 | 0 |
| 243 |  | Vr93 | Vr93 | 1 | 1 | 1 | 1 | 0 | 0 | 1 | 1 |
| 244 |  | Vr94 | Vr93 | 1 | 1 | 1 | 1 | 0 | 1 | 0 | 0 |
| 245 | Vr93 | Vr94 | Vr93 | 1 | 1 | 1 | 1 | 0 | 1 | 0 | 1 |
| 246 |  | Vr94 | Vr94 | 1 | 1 | 1 | 1 | 0 | 1 | 1 | 0 |
| 247 | Vr94 | Vr94 | Vr94 | 1 | 1 | 1 | 1 | 0 | 1 | 1 | 1 |
| 248 |  | Vr95 | Vr94 | 1 | 1 | 1 | 1 | 1 | 0 | 0 | 0 |
| 249 | Vr95 | Vr95 | Vr95 | 1 | 1 | 1 | 1 | 1 | 0 | 0 | 1 |
| 250 |  | Vr96 | Vr95 | 1 | 1 | 1 | 1 | 1 | 0 | 1 | 0 |
| 251 |  | Vr96 | Vr96 | 1 | 1 | 1 | 1 | 1 | 0 | 1 | 1 |
| 252 |  | Vr97 | Vr96 | 1 | 1 | 1 | 1 | 1 | 1 | 0 | 0 |
| 253 | Vr96 | Vr97 | Vr96 | 1 | 1 | 1 | 1 | 1 | 1 | 0 | 1 |
| 254 |  | Vr97 | Vr97 | 1 | 1 | 1 | 1 | 1 | 1 | 1 | 0 |
| 255 | Vr97 | Vr97 | Vr97 | 1 | 1 | 1 | 1 | 1 | 1 | 1 | 1 |

FIG. 26

EMBODIMENT WHERE m=8 HOLDS

FIG.28

| REFERENCE VOLTAGE GROUP | ORDER OF REFERENCE VOLTAGE IN GROUP OF EACH REFERENCE VOLTAGE GROUP | | | | | | | |
|---|---|---|---|---|---|---|---|---|
| | 1 | 2 | 3 | ~ | j | ~ | h-1 | h |
| 1 | $V_r 1$ | $V_r(3S+1)$ | $V_r(6S+1)$ | ~ | $V_r\{(3S)\times(j-1)+1\}$ | ~ | $V_r\{(3S)\times(h-2)+1\}$ | $V_r\{(3S)\times(h-1)+1\}$ |
| 2 | $V_r 2$ | $V_r(3S+2)$ | $V_r(6S+2)$ | ~ | $V_r\{(3S)\times(j-1)+2\}$ | ~ | $V_r\{(3S)\times(h-2)+2\}$ | $V_r\{(3S)\times(h-1)+2\}$ |
| 3 | $V_r 3$ | $V_r(3S+3)$ | $V_r(6S+3)$ | ~ | $V_r\{(3S)\times(j-1)+3\}$ | ~ | $V_r\{(3S)\times(h-2)+3\}$ | $V_r\{(3S)\times(h-1)+3\}$ |
| ... | ... | ... | ... | ... | ... | ... | ... | ... |
| i | $V_r(i)$ | $V_r(3S+i)$ | $V_r(6S+i)$ | ~ | $V_r(3S)(j-1)+i$ | ~ | $V_r\{(3S)\times(h-2)+i\}$ | $V_r\{(3S)\times(h-1)+i\}$ |
| ... | ... | ... | ... | ... | ... | ... | ... | ... |
| 3S | $V_r(3S)$ | $V_r(6S)$ | $V_r(9S)$ | ~ | $V_r(3jS)$ | ~ | $V_r\{(3S)\times(h-1)\}$ | $V_r(3hS)$ |
| 3S+1 | $V_r(3S+1)$ | $V_r(6S+1)$ | $V_r(9S+1)$ | ~ | $V_r(3jS+1)$ | ~ | $V_r\{(3S)\times(h-1)+1\}$ | $V_r(3hS+1)$ |

FIG.29A

| REFERENCE VOLTAGE GROUP (S=1) | ORDER OF REFERENCE VOLTAGE IN GROUP OF EACH REFERENCE VOLTAGE GROUP (h=32) | | | | | | | | |
|---|---|---|---|---|---|---|---|---|---|
| | 1 | 2 | 3 | 4 | ~ | ~ | 30 | 31 | 32 |
| 1 | Vr1 | Vr4 | Vr7 | Vr10 | ~ | Vr{(3S)×(j−1)+1} | Vr88 | Vr91 | Vr94 |
| 2 | Vr2 | Vr5 | Vr8 | Vr11 | ~ | Vr{(3S)×(j−1)+2} | Vr89 | Vr92 | Vr95 |
| 3 | Vr3 | Vr6 | Vr9 | Vr12 | ~ | Vr{(3S)×(j−1)+3} | Vr90 | Vr93 | Vr96 |
| 4 | Vr4 | Vr7 | Vr10 | Vr13 | ~ | Vr{(3S)×(j−1)+4} | Vr91 | Vr94 | Vr97 |

FIG.29B

| REFERENCE VOLTAGE GROUP (S=2) | ORDER OF REFERENCE VOLTAGE IN GROUP OF EACH REFERENCE VOLTAGE GROUP (h=16) | | | | | | | | |
|---|---|---|---|---|---|---|---|---|---|
| | 1 | 2 | 3 | ~ | ~ | 14 | 15 | 16 |
| 1 | Vr1 | Vr7 | Vr13 | ~ | Vr{(3S)×(j−1)+1} | Vr79 | Vr85 | Vr91 |
| 2 | Vr2 | Vr8 | Vr14 | ~ | Vr{(3S)×(j−1)+2} | Vr80 | Vr86 | Vr92 |
| 3 | Vr3 | Vr9 | Vr15 | ~ | Vr{(3S)×(j−1)+3} | Vr81 | Vr87 | Vr93 |
| 4 | Vr4 | Vr10 | Vr16 | ~ | Vr{(3S)×(j−1)+4} | Vr82 | Vr88 | Vr94 |
| 5 | Vr5 | Vr11 | Vr17 | ~ | Vr{(3S)×(j−1)+5} | Vr83 | Vr89 | Vr95 |
| 6 | Vr6 | Vr12 | Vr18 | ~ | Vr{(3S)×(j−1)+6} | Vr84 | Vr90 | Vr96 |
| 7 | Vr7 | Vr13 | Vr19 | ~ | Vr{(3S)×(j−1)+7} | Vr85 | Vr91 | Vr97 |

FIG.30A

| | | | | ORDER OF REFERENCE VOLTAGE IN GROUP OF EACH REFERENCE VOLTAGE GROUP | | | | | | | | | |
|---|---|---|---|---|---|---|---|---|---|---|---|---|---|
| | 1 | - | p | p+1 | p+2 | - | j | - | q-2 | q-1 | q | - | h-1 | h |
| 1 | | | | Vr{((3S)×p+1} | Vr{((3S)×(p+1)+1} | - | Vr{((3S)×(j-1)+1} | - | Vr{((3S)×(h-2)+1} | Vr{((3S)×(q-2)+1} | Vr{((3S)×(q-1)+1} | | | |
| 2 | | | | Vr{((3S)×p+2} | Vr{((3S)×(p+1)+2} | - | Vr{((3S)×(j-1)+2} | - | Vr{((3S)×(h-2)+2} | Vr{((3S)×(q-2)+2} | Vr{((3S)×(q-1)+2} | | | |
| 3 | | | | Vr{((3S)×p+3} | Vr{((3S)×(p+1)+3} | - | Vr{((3S)×(j-1)+3} | - | Vr{((3S)×(h-2)+3} | Vr{((3S)×(q-2)+3} | Vr{((3S)×(q-1)+3} | | | |
| - | | | | | --- | - | --- | - | --- | --- | --- | | | |
| REFERENCE VOLTAGE GROUP X | | | Vr{((3S)×(p-1)+X} | --- | Vr{((3S)×p+X} | - | Vr{((3S)×(j-1)+X} | - | Vr{((3S)×(h-2)+X} | Vr{((3S)×(q-2)+X} | Vr{((3S)×(q-1)+X} | | | |
| - | | | --- | | --- | - | --- | - | --- | --- | --- | | | |
| Y | | | Vr{((3S)×(p-1)+Y} | --- | Vr{((3S)×p+Y} | - | Vr{((3S)×(j-1)+Y} | - | Vr{((3S)×(h-2)+Y} | Vr{((3S)×(q-2)+Y} | Vr{((3S)×(q-1)+Y} | | | |
| - | | | --- | | --- | - | --- | - | --- | --- | --- | | | |
| 3S | | | Vr{((3S)×p} | Vr{((3S)×(p+1)} | Vr{((3S)×(p+2)} | - | Vr(3jS) | - | Vr{((3S)×(h-1)} | Vr{((3S)×(q-1)} | Vr{((3S)×(q-1)+X} | | | |
| 3S+1 | | | Vr{((3S)×p+1} | Vr{((3S)×(p+1)+1}+1 | Vr{((3S)×(p+2)+1} | - | Vr(3jS+1) | - | Vr{((3S)×(h-1)+1} | Vr{((3S)×(q-1)+1} | Vr{((3S)×(q-1)+Y} | | | |

FIG.30B

| | | | ORDER OF REFERENCE VOLTAGE IN GROUP OF EACH REFERENCE VOLTAGE GROUP | | | | | | | | | | | |
|---|---|---|---|---|---|---|---|---|---|---|---|---|---|---|
| | | 1 | ... | p | p+1 | p+2 | ... | j | ... | q-2 | q-1 | q | ... | h-1 | h |
| REFERENCE VOLTAGE GROUP | 1 | | | | $V_r\{(3S)\times p+1\}$ | $V_r\{(3S)\times(p+1)+1\}$ | - | $V_r\{(3S)\times(j-1)+1\}$ | - | $V_r\{(3S)\times(h-2)+1\}$ | $V_r\{(3S)\times(q-2)+1\}$ | $V_r\{(3S)\times(q-1)+1\}$ | | | |
| | 2 | | | | $V_r\{(3S)\times p+2\}$ | $V_r\{(3S)\times(p+1)+2\}$ | - | $V_r\{(3S)\times(j-1)+2\}$ | - | $V_r\{(3S)\times(h-2)+2\}$ | $V_r\{(3S)\times(q-2)+2\}$ | $V_r\{(3S)\times(q-1)+2\}$ | | | |
| | 3 | | | | $V_r\{(3S)\times p+3\}$ | $V_r\{(3S)\times(p+1)+3\}$ | - | $V_r\{(3S)\times(j-1)+3\}$ | - | $V_r\{(3S)\times(h-2)+3\}$ | $V_r\{(3S)\times(q-2)+3\}$ | $V_r\{(3S)\times(q-1)+3\}$ | | | |
| | ... | | | | --- | --- | ... | ... | ... | ... | ... | ... | | | |
| | Y | | | | $V_r\{(3S)\times p+Y\}$ | $V_r\{(3S)\times(p+1)+Y\}$ | - | $V_r\{(3S)\times(j-1)+Y\}$ | - | $V_r\{(3S)\times(h-2)+Y\}$ | $V_r\{(3S)\times(q-2)+Y\}$ | $V_r\{(3S)\times(q-1)+Y\}$ | | | |
| | ... | | | | --- | --- | ... | ... | ... | ... | ... | | | | |
| | X | | | $V_r\{(3S)\times(p-1)+X\}$ | $V_r\{(3S)\times p+X\}$ | $V_r\{(3S)\times(p+1)+X\}$ | - | $V_r\{(3S)\times(j-1)+X\}$ | - | $V_r\{(3S)\times(h-2)+X\}$ | $V_r\{(3S)\times(q-2)+X\}$ | | | | |
| | ... | | | ... | ... | | | ... | | | | | | | |
| | 3S | | | $V_r\{(3S)\times p\}$ | $V_r\{(3S)\times p+1\}$ | $V_r\{(3S)\times(p+2)\}$ | - | $V_r(3jS)$ | - | $V_r\{(3S)\times(h-1)\}$ | $V_r\{(3S)\times(q-1)\}$ | | | | |
| | 3S+1 | $V_r\{(3S)\times p+1\}$ | | $V_r\{(3S)\times p+1\}$ | $V_r\{(3S)\times(p+1)+1\}$ | $V_r\{(3S)\times(p+2)+1\}$ | - | $V_r(3jS+1)$ | - | $V_r\{(3S)\times(h-1)+1\}$ | $V_r\{(3S)\times(q-1)+1\}$ | | | | |

FIG.31A

| REFERENCE VOLTAGE GROUP (S=1) | ORDER OF REFERENCE VOLTAGE IN GROUP OF EACH REFERENCE VOLTAGE GROUP (h=32) | | | | | | | |
|---|---|---|---|---|---|---|---|---|
| | 1 | 2 | 3 | 4 | ? | 30 | 31 | 32 |
| 1 | | | Vr7 | Vr10 | ? | Vr88 | | |
| 2 | | Vr7 | Vr8 | Vr11 | ? | Vr89 | | |
| 3 | | Vr8 | Vr9 | Vr12 | ? | Vr90 | | |
| 4 | | Vr9 | Vr10 | Vr13 | ? | Vr91 | | |

At the right end: $Vr[(3S) \times (j-1)+1]$, $Vr[(3S) \times (j-1)+2]$, $Vr[(3S) \times (j-1)+3]$, $Vr[(3S) \times (j-1)+4]$

FIG.31B

| REFERENCE VOLTAGE GROUP (S=2) | ORDER OF REFERENCE VOLTAGE IN GROUP OF EACH REFERENCE VOLTAGE GROUP (h=16) | | | | | | | |
|---|---|---|---|---|---|---|---|---|
| | 1 | 2 | 3 | ? | 14 | 15 | 16 | |
| 1 | | Vr7 | Vr13 | ? | Vr79 | Vr85 | | |
| 2 | | Vr8 | Vr14 | ? | Vr80 | Vr86 | | |
| 3 | | Vr9 | Vr15 | ? | Vr81 | Vr87 | | |
| 4 | | Vr10 | Vr16 | ? | Vr82 | Vr88 | | |
| 5 | | Vr11 | Vr17 | ? | Vr83 | Vr89 | | |
| 6 | | Vr12 | Vr18 | ? | Vr84 | Vr90 | | |
| 7 | | Vr13 | Vr19 | ? | Vr85 | Vr91 | | |

Formula column: $Vr[(3S) \times (j-1)+1]$ through $Vr[(3S) \times (j-1)+7]$

FIG.31C

| REFERENCE VOLTAGE GROUP (S=4) | ORDER OF REFERENCE VOLTAGE IN GROUP OF EACH REFERENCE VOLTAGE GROUP (h=8) | | | | | | |
|---|---|---|---|---|---|---|---|
| | 1 | 2 | 3 | ? | 7 | 8 | |
| 1 | | Vr13 | Vr25 | ? | Vr72 | Vr85 | |
| 2 | | Vr14 | Vr26 | ? | Vr73 | Vr86 | |
| 3 | | Vr15 | Vr27 | ? | Vr74 | Vr87 | |
| 4 | | Vr16 | Vr28 | ? | Vr75 | Vr88 | |
| 5 | | Vr17 | Vr29 | ? | Vr76 | Vr89 | |
| 6 | | Vr18 | Vr30 | ? | Vr78 | Vr90 | |
| 7 | Vr7 | Vr19 | Vr31 | ? | Vr79 | Vr91 | |
| 8 | Vr8 | Vr20 | Vr32 | ? | Vr80 | | |
| 9 | Vr9 | Vr21 | Vr33 | ? | Vr81 | | |
| 10 | Vr10 | Vr22 | Vr34 | ? | Vr82 | | |
| 11 | Vr11 | Vr23 | Vr35 | ? | Vr83 | | |
| 12 | Vr12 | Vr24 | Vr36 | ? | Vr84 | | |
| 13 | Vr13 | Vr25 | Vr37 | ? | Vr85 | | |

Formula column: $Vr[(3S) \times (j-1)+1]$ through $Vr[(3S) \times (j-1)+13]$

DIGITAL-TO-ANALOG CONVERTING CIRCUIT, DATA DRIVER AND DISPLAY DEVICE

REFERENCE TO RELATED APPLICATION

This application is based upon and claims the benefits of the priority of Japanese patent application No. 2008-028020, filed on Feb. 7, 2008 and Japanese patent application No. 2009-016225, filed on Jan. 28, 2009, the disclosures of which are incorporated herein in its entirety by reference thereto.

TECHNICAL FIELD

This invention relates to a digital-to-analog converting circuit, a data driver having this circuit and a display device having the data driver.

BACKGROUND

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive and are capable of presenting a high-definition display are being utilized as these liquid crystal displays devices.

First, reference will be had to FIG. 17 to describe the typical configuration of a liquid crystal display device that employs active-matrix drive. The principal components connected to one pixel of a liquid crystal display unit are illustrated schematically by equivalent circuits in FIG. 17.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 967 is formed; and a liquid crystal material sealed between these two substrates arranged to oppose each other. The liquid crystal has capacitance and forms a capacitor 965 between the pixel electrode 964 and the electrode 967. Often an auxiliary capacitor 966 for assisting the capacitance of the liquid crystal is provided.

In this liquid crystal display device, the TFT 963, which has a switching function, is turned on and off under the control of a scanning signal. When the TFT 963 is on, a gray-scale level signal voltage that corresponds to a video data signal is applied to the pixel electrode 964, and the transmittance of the liquid crystal changes owing to a potential difference between each pixel electrode 964 and opposing-substrate electrode 967. This potential difference is held for a fixed period of time by the liquid-crystal capacitor 965 and auxiliary capacitor 966 even after the TFT 963 is turned off, as a result of which an image is displayed.

A data line 962 that sends a plurality of level voltages (gray-scale level signal voltages) applied to each pixel electrode 964 and a scanning line 961 that sends the scanning signal are wired on the semiconductor substrate in the form of a grid (the data lines are 1280×3 in number and the scanning lines are 1024 in number in the case of the above-mentioned color SXGA panel). The scanning line 961 and data line 962 constitute a large capacitive load owing to the capacitance produced at the intersection of these lines and capacitance, etc., of the liquid crystal sandwiched between the opposing-substrate electrodes.

It should be noted that the scanning signal is supplied to the scanning line 961 from a gate driver 970, and that the supply of gray-scale level signal voltage to each pixel electrode 964 is performed by a data driver 980 via the data line 962. Further, the gate driver 970 and data driver 980 are controlled by a display controller 950, a required clock CLK and control signals, etc., are supplied from the display controller 950, and video data is supplied to the data driver 980. At the present time, video data is principally digital data. A power-supply circuit 940 supplies driving power to the gate driver 970 and data driver 980.

Data rewriting of one screen is usually performed in one frame time interval (usually 1/60 seconds). Using each scan line, every pixel line (every line) is selected one by one, and within a selected period, the gray scale voltage is supplied through each data line.

Although the gate driver 970 need only supply at least a bi-level scanning signal, it is required that the data driver 980 drive the data lines by gray-scale level signal voltages of multiple levels that conform to the number of gray-scale levels. To this end, the data driver 980 has a digital-to-analog converter (DAC) comprising a decoder for converting video data to a gray-scale level signal voltage and an operational amplifier for amplifying the gray-scale level signal voltage and outputting the amplified signal to the data line 962.

Progress has been made in raising image quality (increasing the number of colors) in portable telephone terminals, laptop personal computers and liquid crystal TVs, etc. However, there is now growing demand for video data of six bits per each of the colors R, G, B (260,000 colors) and preferably 8-bit video data (16,800,000 colors) or higher.

For this reason, a data driver that outputs a gray-scale level signal voltage corresponding to multiple-bit video data is now required to output multiple gray-scale level voltages and, in addition, to produce highly accurate voltage outputs corresponding to tones. If the number of reference voltages generated in correspondence with multiple gray-scale level voltages is increased, then this causes an increase in the number of elements in a reference voltage generating circuit and in the number of reference voltage wires and in the number of switching transistors in the decoder circuit that selects reference voltages conforming to input video signals.

That is, progress in raising the number of gray-scale levels (represented by eight to ten bits or more) used invites an increase in the area of the decoding circuitry and an increase in the cost of the driver. The area of a multiple-bit DAC depends upon the decoder configuration.

A technique for reducing the number of reference voltages as well as the number of switching transistors in the decoder configuration by utilizing interpolation (an interpolation amplifier) is known in the art. A DAC having a configuration of the kind shown in FIG. 18 is disclosed in Patent Document 1 (Japanese Patent Kokai Publication No. JP2000-183747A) as related art of this type (see FIG. 1 in Patent Document 1). Referring to FIG. 18, a reference voltage generating circuit 118 produces reference voltages, which correspond to every other levels and are one-half plus one of the voltage levels which are output from the amplifier 117. In accordance with digital data, a selecting circuit (decoder) 116 selects two voltages out of reference voltages output by the reference voltage generating circuit 118. An interpolation amplifier 117 outputs a voltage obtained by interpolating the two voltages with a ratio of 1:1. The selecting circuit (decoder) 116 successively selects bits from the most significant bit (MSB: bit 5) toward the least significant bit (LSB: bit 0) of input digital data. The numbers of switches in the selecting circuit (decoder) 116 are 74, 270 and 1042 if the input digital data is composed of six bits, eight bits and 10 bits, respectively, as illustrated in FIG. 20A.

Further, a technique for reducing number of reference voltages and number of switching transistors by utilizing interpolation is disclosed in Patent Document 2 (Japanese Patent Kokai Publication No. JP2001-34234A). FIG. 19 is a diagram illustrating the configuration of a selecting circuit in a digital-to-analog converting circuit of a data driver disclosed in Patent Document 1 (see FIG. 10 in Patent Document 2). This arrangement uses an output amplifier circuit (interpolation amplifier) having two inputs (the amplifier is not shown). The interpolation amplifier receives OUT1 (Vn) and OUT2 (Vn+2) as inputs and outputs voltages obtained by internally dividing these two inputs at a ratio of 1:1. Tournament decoders (tournaments 1, 2, 3) are used as decoders for dividing an 8-bit input into six bits and two bits and decoding the 6-bit signal. With regard to 8-bit display data, input gray-scale levels (D0P, D0N, D1P, D1N, D2P, D2N, D3P, D3N, D4P, D4N, D5P, D5N) of six bits are divided into the following three blocks (A, B, C): Specifically, V(0), V(8), ... V(0+8n), ... V(248), V(256) are decoded by tournament 1; V(2), V(6), ... V(2+4n), ... V(250), V(254) are decoded by tournament 2; and V(4), V(4+8n), ... V(252) are decoded by tournament 3.

A 6-bit-input first decoder ($1^{st}$ decoder) is constructed by tournament 1, tournament 2 and tournament 3. Outputs VA, VB and VC of the $1_{st}$ decoder are input to a 2-bit (D6P, D6N, D7P and D7N) $2_{nd}$ decoder) through a selecting circuit to which changeover signals D0N, D0P are applied, and two outputs OUT1(Vn) and OUT2(Vn+2) are obtained. The changeover signals D0N and D0P are applied to both the $1_{st}$ decoder and the $2_{nd}$ decoder. The selecting circuit selects one output from among the outputs VA, VB and VC of tournaments 1, 2 and 3, respectively, and inputs it to the $2_{nd}$ decoder. The two outputs OUT1(Vn) and OUT2(Vn+2) of the $2_{nd}$ decoder are input to the 2-input output amplifier circuit (interpolation amplifier) (not shown). This circuit approximately halves the number of reference voltages (gray-scale level voltages) using an interpolation amplifier. In accordance with the digital data, the decoder selectively outputs two voltages out of a number of reference voltages that is one-half plus one the number of outputs. Bits are selected from the least significant bit toward the most significant bit.

Patent Document 3 (Japanese Patent Kokai Publication No. JP2006-174180A) (see FIGS. 7 and 8 in Patent Document 3) discloses an arrangement of the kind shown in FIG. 21 in order to reduce the number of gray-scale level line even further. An interpolation amplifier outputs Vout=[V(T1)+V(T2)]/2. With reference to FIG. 21, means for selecting two voltages that are input to terminals T1 and T2 of a differential amplifier 400 includes a resistor string for outputting n analog voltages V1, V2, ..., and Vn from respective taps; a first group composed of n switches S1a to Sna for selecting one voltage VS (where S represents an integer from 1 to n) from the taps; and a second group composed of n switches S1b to Snb for selecting one voltage VJ (where J represents an integer from 1 to n) from the taps. An Sth switch and a number Jth switch (Ssa and Sjb, respectively) of the first and second switch groups are turned on by an output of a decoder based on all of the bit signals (MSB+LSB) of the input data, whereby it is possible to select any combination (VS, VJ) of tap voltages, including duplicate values as voltages (VT1, VT2) of the terminals T1, T2. The differential amplifier 400 includes a first differential pair (101, 102); a second differential pair (103, 104); a current mirror circuit (111, 112) connected to the output pairs of the first and second differential pairs and forming a common active load with respect to the first and second differential pairs; an amplifier stage 6, to which output signals of the current mirror circuits (111, 112) are input, for outputting a voltage Vout to an output terminal 3; and current control transistors 126, 127 for supplying currents (11, 12) that flow into the first and second differential pairs. A control terminal (gate) of transistor 101 of the first differential pair is connected to an input terminal T1, a control terminal (gate) of transistor 103 of the second differential pair is connected to an input terminal T2, and control terminals of transistors 102, 104 of the first and second differential pairs are both connected to the output terminal 3. Output voltage Vout is fed back to the input side. Further, let VT1 and VT2 represent the terminal voltages of the input terminals T1 and T2, respectively. Bias voltages VB11, VB12 are supplied to the control terminals (gates) of the current control transistors 126, 127, respectively.

FIG. 21 illustrates a typical configuration of the current mirror circuit (111, 112) connected between output pairs of the respective first differential pair (101, 102) and second differential pair (103, 104) and a high-potential power supply VDD. Specifically, the current mirror circuit (111, 112) includes transistors 111 and 112. A source of the transistor 112 is connected to the high-potential power supply VDD, and a drain and a gate of the transistor 112 are connected in a diode configuration and form an input terminal of the current mirror circuit. A source and a gate of the transistor 111 are connected to the power supply VDD and to the gate of the transistor 112, respectively, and a drain of the transistor 111 forms an output terminal of the current mirror circuit. An input terminal of the current mirror circuit (the drain of the transistor 112) is connected in common with the drains of the transistors 102 and 104, and an output terminal of the current mirror circuit (the drain of the transistor 111) is connected in common with the drains of the transistors 101 and 103 and forms an output terminal 4 of the differential stage. The output terminal 4 is connected to the input terminal of the amplifying stage 6.

The differential amplifier 400, in which the first differential pair (101,102) and the second differential pair (103,104) are composed by transistors having the same characteristics, when the current ratio of currents I1 and I2 which respectively flows through the first differential pair (101,102) and the second differential pair (103,104) assumes an equal value, that is I1=I2, is capable of outputting a voltage obtained by internally dividing (or interpolating) the voltages VT1 and VT2 at the input terminals T1 and T2 with an internal ratio 1:1.

FIG. 22 shows an example of a method of selecting the two input voltages applied to the terminals T1 and T2 of the differential amplifier 400 of FIG. 21. FIG. 22 shows, in a tabulated form, nine voltages of equally spaced levels, four voltages A, B, C, D different from one another and output from respective taps of the resistor string of FIG. 21, and combinations of two voltages that are input to the terminals T1 and T2. It does not matter which one of the voltages in a combination of the two voltages is output to which one of the terminals T1 and T2. The number of voltages applied to the terminals T1 and T2 is only four, which is less than one-half the number of output voltages of the nine levels. However, the two voltages that are input can be combined such that when the voltage A, for example, is selectively input to one of the two terminals (T1, T2), any of the four voltages A, B, C and D can be applied to the other terminal. Thus, there are a total of ten combinations of two out of four voltages, thereby making a 9-level linear output possible. The first to fourth reference voltages (A, B, C, D) having voltage values that differ from one another are input to the differential amplifier 400 (the four reference voltages A, B, C, D are set to first, third, seventh and ninth voltage levels from among the output voltages of the nine levels). Any pair among the following pairs is supplied to the terminals T1 and T2 of the differential amplifier 400:

(1) the pair of first voltages (A,A), output level=(A+A)/2;
(2) the first and second voltages (A,B), output level=(A+B)/2;
(3) the pair of second voltages (B,B), output level=(B+B)/2;
(4) the first and third voltages (A,C), output level=(A+C)/2;
(5) the second and third voltages (B,C), output level=(B+C)/2, or the first and fourth voltages (A,D), output level=(A+D)/2;
(6) the second and fourth voltages (B,D), output level=(B+D)/2;
(7) the pair of third voltages (C,C), output level=(C+C)/2;
(8) the third and fourth voltages (C,D), output level=(C+D)/2; and
(9) the pair of fourth voltages (D,D), output level=(D+D)/2.

A maximum of nine voltage levels that differ from one another are output from the output terminal of the differential amplifier 400. Two combinations of two voltages applied to the terminals (T1, T2) for implementing the output of the fifth level are possible, namely the combination of voltages B and C and the combination of voltages A and D.

In FIG. 22, the first to eighth levels among the output voltages of the nine levels can be made to correspond to data (0,0,0) to (1,1,1) with respect to 3-bit digital data (D2,D1, D0).

Patent Document 1

Japanese Patent Kokai Publication No. JP2000-183747A

Patent Document 2

Japanese Patent Kokai Publication No. JP2001-34234A

Patent Document 3

Japanese Patent Kokai Publication No. JP2006-174180A

SUMMARY

The disclosures of Patent Documents 1 to 3 are herewith incorporated by reference in their entirety. An analysis of the related art in the present invention is given below.

With the configuration of the related art (Patent Document 1) described above with reference to FIG. 18, there are many wiring intersections between switches and the wiring area is large on the side of upper bits of the input digital data. For example, in FIG. 18, between switch pairs SW (5,1) to SW (5,17) controlled by Bit 5 and switch pairs SW (4,1) to SW (4,9) controlled by Bit 4, output wiring from SW (5,2) to SW (4,2) intersects output wiring from SW (5,9) to SW (4,1) (intersection at one location). Output wiring from SW (5,3) to SW (4,3) intersects output wiring from SW (5,9) to SW (4,1) and output wiring from SW (5,10) to SW (4,2) (intersection at two locations). Output wiring from SW (5,4) to SW (4,4) has intersections at three locations. Similarly, there are intersections at up to eight locations for the output wiring from SW (5,9) to SW (4,9), for a total of 36 intersections. Even though the number of these wiring cross points differs depending upon the placement of the switch pairs, a large number of wiring intersections is produced. If there is an increase in the number of bits, the number of wiring cross sections increases even more on the side of the upper bits. For example, if a switch pair controlled by a Bit 6 as a bit of higher order than Bit 5 is added on in FIG. 18, the number of wiring intersections between the switch pairs controlled by Bit 6 and Bit 5 is 136. In an actual device such as an LSI chip, there are instances where the number of wiring layers such as metal layers is limited in order to hold down process cost. In cases where a circuit is formed using a small number of wiring layers, the larger the number of wiring cross points, the larger the layout area (an analysis by the inventor).

With the configuration of the related art (Patent Document 2) described above with reference to FIG. 19, although wiring intersections between switches of the kind shown in FIG. 18 basically do not occur owing to the tournaments 1, 2, 3 of the $1^{st}$ decoder, the number of switching transistors of the decoder increases. The number of switches (switching transistors) of the decoder in FIG. 19 is illustrated in FIG. 20B (an analysis by the inventor). In accordance with FIG. 20B, the number of switching transistors of the decoder in FIG. 19 is about 1.2 times the number of switching transistors (see FIG. 20A) in decoder 116 in FIG. 18. That is, although the decoder of FIG. 19 involves almost no increase in area ascribable to wiring intersections, the area needed for the switching transistors is larger than that of the decoder of FIG. 18. Further, in the decoder of FIG. 19, a selection is made twice by the bits signals (D0N, D0P) and therefore the ON resistance of the switching transistors increases. (For example, the selection by D0N, D0P is performed in tournaments 1 and 2 of the $1^{st}$ decoder, and D0N, D0P are used in order to select the outputs VA, VB, VC of tournaments 1, 2, 3 in the $2^{nd}$ decoder. In order to reduce the ON resistance of switching transistors, it is necessary to increase the W (channel width) size of the switching transistors. This results in an increase in area.

With the configuration of the related art (Patent Document 3) described above with reference to FIGS. 21 and 22, eight gray-scale levels are selectively output by four reference voltages (A, B, C, D), by way of example. That is, it is possible to reduce the decoder area by reducing the number of wires corresponding to the number of reference voltages. However, there is no disclosure regarding the configuration of a decoder that reduces the number of switching elements. The area of the multiple-bit DAC depends upon the decoder configuration, as mentioned earlier.

Accordingly, an object of the present invention is to provide a decoder, driver and display device in which it is possible to reduce area by reducing the number of reference voltages.

The invention disclosed in this application has the structure set forth below in order to solve the foregoing problems.

According to a first aspect of the present invention, there is provided a digital-to-analog converting circuit selecting, in accordance with an input digital signal, first and second voltages out of a plurality of reference voltages that differ from one another, and outputting a voltage level obtained by interpolating selected first and second voltages. The digital-to-analog converting circuit includes a decoder selecting, responsive to an input digital signal, first and second voltages out of a reference voltage family including a plurality of reference voltages that differ from one another, the plurality of reference voltages of the reference voltage family being grouped into first to (3S+1)th reference voltage groups, where S is one or a prescribed positive integer of a power of 2, an i-th reference voltage group, where i is an any one of 1 to (3S+1), including {3S×(j−1)+i}th reference voltages, where j=1, 2, . . . , h, h being a prescribed positive integer.

The decoder includes:

first to (3S+1)th subdecoders provided respectively in correspondence with the first to (3S+1)th reference voltage groups, each of subdecoders being able to select one reference voltage out of the plurality of reference voltages of the corresponding reference voltage group in accordance with values of a first bit group of the input digital signal; and a (3S+1)-input and 2-output subdecoder selecting the first and second voltages out of reference voltages selected by the first to (3S+1)th subdecoders, in accordance with values of a second bit group of the input digital signal.

The digital-to-analog converting circuit further includes an interpolation circuit receiving the first and second voltages selected by the decoder and producing a voltage level obtained by interpolating the first and second voltages with a predetermined interpolate ratio.

In the present invention, the reference voltages of the reference voltage family are grouped into the first to (3S+1)th reference voltage groups, in such a manner that the {(3S)×(j−1)+i}th reference voltage of the i-th reference voltage group corresponds to i-th row and j-th column array element, where i is any integer greater than or equal to 1 and less than or equal to (3S+1), and j is any integer greater than or equal to 1 and less than or equal to h, in a two dimension array having (3S+1) rows and h columns where h is a prescribed integer greater than or equal to 2. The first to (3S+1)th reference voltage groups are allocated in the rows of the two dimension array. The order of respective reference voltages in the reference voltage group to which the reference voltage belongs is allocated to the columns of the two dimension array.

In the present invention, the first to (3S+1)th reference voltage groups each include reference voltages corresponding to the first to h-th columns in the first to (3S+1)th rows of the two dimension array.

In the present invention, the first to (3S+1)th reference voltage groups include (p+1)th to (q−1)th columns, where p is any integer which is greater than or equal to 1 and less than or equal to (h−1), and q is any integer which is greater than or equal to 3 and less than or equal to h. X-th to (3S+1)th reference voltage groups, where X is any integer which is greater than or equal to 1 and less than (3S+1), out of the first to (3S+1)th reference voltage groups, include reference voltages corresponding to p-th column in Xth to (3S+1)th rows of the two dimension array. First to Yth reference voltage groups, where Y is any integer which is greater than 1 and less than or equal to (3S+1), out of the first to (3S+1)th reference voltage groups, include reference voltages corresponding to q-th column in the first to Yth rows of the two dimension array.

In the present invention, the first to (3S+1)th sundecoders each may receive the first bit group of upper (m−n) bits of the m bits digital data, where m is a predetermined positive integer and m>n, and select reference voltages allocated to a column of the two dimension array corresponding to the value of the first bit group. Reference voltages, the number of which is less than or equal to (3S+1) are output, from the first to (3S+1)th sundecoders. The (3S+1)-inputs and 2-outputs sundecoder selects and outputs the first and second voltages out of the reference voltages selected by the first and (3S+1) sundecoders in accordance with the second bit group which is the lower n bits of the m bit digital data.

In the present invention, the first to (3S+1)th sundecoders each may decode the upper (m−n) bits successively from lower side bits to upper side bits.

In the present invention, the first to (3S+1)th subdecoders select (3S+1) or less reference voltages out of the first to (3S+1)th reference voltage groups, based upon the first bit group. The reference voltages selected by the first to (3S+1)th subdecoders are made voltages which are continuous in order in the reference voltage family.

In the present invention, the interpolate ratio of the interpolation circuit may be set to 1:1. Respective reference voltages of the reference voltage family correspond to a plurality of output voltage levels output from the interpolation circuit and include (3N'+1) reference voltage which are allocated, with regard to A-th output voltage level, (8N+A)th output voltage level, (8N+A+2)th output voltage level, (8N+A+6)th output voltage level, and (8N'+A)th output voltage level, where N=0, 1, 2, . . . (N'−1), and N' is a prescribed integer more than 1.

In the present invention, S may be an integer greater than or equal to 2. The second bit group is composed by lower order n bits of the input digital signal, where n is an integer greater than or equal to 4 and the lower order n bits exceed 3 bits. The (3S+1)-input and 2-output subdecoder includes:

a preceding-stage subdecoder selecting four reference voltages out of the reference voltages selected by the first to (3S+1)th subdecoders, based upon higher order (n−3) bits, which is the amount by which 3 bits is exceeded, of the second bit group; and a succeeding-stage subdecoder selecting the first and second voltages out of the four reference voltages selected by the preceding-stage subdecoder, in accordance with lower order 3 bits of the second bit group.

Alternatively, in the present invention, S is one. The second bit group is composed by lower order 3 bits of the input digital signal, the (3S+1)-input and 2-output subdecoder selecting and outputting the first and second voltages out of four reference voltages, selected by the first to fourth subdecoders, in accordance with the second bit group.

In the present invention, a plurality of output voltage levels produced by the interpolation circuits, include a plurality of blocks in which one block has eight adjacent output voltage levels. One block out of the plurality of the blocks is selected by the first bit group of the input digital signal and bits that exceed the lower three bits of the second bit group of the input digital signal.

In relation to first to eighth levels spaced apart from one another in unit steps and constituting the one block, the decoder selects any one of the following pairs as the first and second voltages, in correspondence with first, second and third reference voltages corresponding respectively to first, third and seventh levels and a fourth reference voltage corresponding to a first level of an other block neighboring to the one block on the side of the eight level of the one block, based upon the lower three bits of the second bit group:

(1) the first reference voltage and the first reference voltage;

(2) the first and second reference voltages;

(3) the second reference voltage and the second reference voltage;

(4) the first and third reference voltages;

(5) the second and third reference voltages or the first and fourth reference voltages;

(6) the second and fourth reference voltages;

(7) the third reference voltage and the third reference voltage; and (8) the third and fourth reference voltages;

and supplies the selected reference voltages to the interpolation circuit as the first and second voltages.

In the present invention, a plurality of output voltage levels produced by the interpolation circuits, include a plurality of blocks in which one block has eight adjacent levels. One block out of the plurality of the blocks is selected by the first bit group of the input digital signal and bits that exceed the lower three bits of the second bit group of the input digital signal. In relation to first to eighth levels spaced apart from one another in unit steps and constituting the one block, the decoder selects any one of the following pairs as the first and second voltages, in correspondence with second, third and fourth reference voltages corresponding respectively to second, sixth and eighth levels and a first reference voltage corresponding to an eight level of an other block neighboring to the one block on the side of the first level of the one block, based upon the lower three bits of the second bit group:

(1) the first and second reference voltage;

(2) the second reference voltage and the second reference voltage;

(3) the first and third reference voltage;

(4) the second and third reference voltages or the first and fourth reference voltages;

(5) the second and fourth reference voltages;

(6) the third reference voltage and the third reference voltage;

(7) the third and fourth reference voltages; and (8) the fourth reference voltage and the fourth reference voltage; and supplies the selected reference voltages to the interpolation circuit as the first and second voltages.

In the present invention, there may be provided a predecoder receiving as an input and decoding a prescribed bit field of the first bit group of the input digital signal. A signal decoded by the predecoder and a bit signal of the first bit group, with the exception of the prescribed bit field, being supplied to the first to (3S+1)th subdecoders.

In the present invention, the interpolation circuit comprises an amplifier circuit which produces a voltage obtained by interpolating the first and second voltages with an interpolation ratio 1:1 or one of the first and second voltages.

In the present invention, the interpolation circuit comprises a differential amplifier circuit which produces a voltage obtained by interpolating the first and second voltages with an interpolation ratio 1:1 or one of the first and second voltages.

In the present invention, when the decoder selects and outputs the same reference voltage as the first and second voltages, the amplifier circuit outputs a voltage identical with the same reference voltages.

In the present invention, there may be provided at least one separate reference voltage family that includes a plurality of reference voltages having a range different from a range of output levels defined by the first to (3S+1)th reference voltage groups, and further comprises a separate decoder receiving the reference voltages of the separate reference voltage family as inputs and selecting third and fourth voltages in accordance with the input digital signal. The separate decoder having an output coupled with the output of the decoder. The interpolation circuit producing a voltage level obtained by interpolating the third and fourth voltages with the predetermined interpolation ratio.

In the present invention, the separate reference voltage family may include reference voltages corresponding to output levels over a voltage range on an upper side and/or lower side of the voltage range of the output voltage levels defined by the first to (3S+1)th reference voltage groups. The separate reference voltage family includes reference voltages corresponding by one to one to respective ones of the output voltage levels. The separate decoder corresponding to the separate reference voltage family selects identical reference voltages in accordance with the input digital signal and outputs selected reference voltages as the third and fourth voltages.

In the present invention, the separate reference voltage family includes reference voltages corresponding to output levels over a voltage range on an upper side and/or lower side of the voltage range of the output voltage levels defined by the first to (3S+1)th reference voltage groups. The separate reference voltage family includes reference voltages corresponding to levels obtained by extracting the output levels every other level. The separate decoder corresponding to the separate reference voltage family selects identical reference voltages or neighboring reference voltages in accordance with the input digital signal and outputs the selected reference voltages as the third and fourth voltages.

In accordance with the present invention, there is provided a data driver having the above-described digital-to-analog converting circuit for receiving an input digital signal conforming to an input video signal and outputting a voltage conforming to the input digital signal.

In accordance with the present invention, there is provided a display device having unit pixels, each of which includes a pixel switch and a display element, provided at intersections of data lines and scanning lines, wherein signals on the data lines are written to the display elements via pixel switches that have been turned on by the scanning lines; the display device having the above-described data driver as a data driver for driving the data lines.

In accordance with the present invention, it is possible to provide a decoder, driver and display device in which the number of reference voltages necessary can be reduced with respect to the number of output levels, thereby enabling a reduction in area.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2A is a diagram useful in describing the specifications of the exemplary embodiment, and FIG. 2B is a diagram useful in describing an amplifier circuit;

FIG. 9 is a diagram in which numbers of switches of decoders in an exemplary embodiment of the present invention are shown in tabular form;

FIG. 20 is a diagram in which numbers of switches of decoders in related art (Patent Document 2) are shown in tabular form;

FIG. 22 is a diagram illustrating the configuration of related art (Patent Document 3);

FIG. 25 is a diagram illustrating a modification of the specifications of FIG. 2;

FIG. 26 is a diagram illustrating a modification of the specifications of FIG. 14;

FIG. 28 is a diagram illustrating the detail of grouping of the reference voltage family 20 in FIG. 1;

FIGS. 29A and 29B are diagrams illustrating the specific examples for S=1 and 2 in FIG. 28;

FIGS. 30A and 30B are diagrams illustrating the details of grouping on the reference voltage group 20D in FIG. 15; and FIGS. 31A, 31B and 31C are diagrams illustrating the specific examples details in case of S=1, 2, and 4 in FIGS. 30A and 30B.

PREFERRED MODES OF THE INVENTION

The present invention will now be described in detail with reference to the accompanying drawings. In the present invention, a DAC selects, in accordance with an input digital signal of a prescribed number of bits (m bits), first and second voltages, out of a reference voltage family (20) including a plurality of reference voltages that differ from one another, and outputs a voltage level obtained by interpolating the first and second voltages. A plurality of reference voltages of the reference voltage family are grouped into first to (3S+1)th reference voltage groups (where S is one or an integer that is a power of 2, 1, 2, 4 . . . ). If this is expressed in the arrangement of FIG. 1 using an index j (where j=1, 2, . . . h holds and h represents a prescribed integer), then a first reference voltage group 20-1 includes Vr[(3S)×(j−1)+1], a second reference voltage group 20-2 includes Vr[(3S)×(j−1)+2], and, similarly, a (3S+1)th reference voltage group 20-(3S+1) includes Vr[(3S)×(j−1)+(3S+1)]=Vr(3jS+1). That is, an i-th reference voltage group (where i is 1 to (3S+1)), includes [(3S)×(j−1)+i]th reference voltages. It should be noted that with regard to the index j, an arrangement may be adopted in which some of the values of j=1, 2, . . . h are excluded in the first to (3S+1)th reference voltage groups, as in the exemplary embodiment of FIG. 14, described later. A decoder (10) includes first to (3S+1)th subdecoders (11-1) to 11-(3S+1) which are provided in correspondence with the first to (3S+1)th reference voltage groups and each of which is able to select one reference voltage out of the plurality of reference voltages of the corresponding reference voltage group in accordance with values of a first bit group [D(m−1) to Dn] on a higher order side of the input digital signal; and a (3S+1)-input and 2-output subdecoder (13) which selects first and second voltages, inclusive of a case in which the first and second voltages are the same reference voltage, out of (3S+1) or less reference voltages which have been selected by the first to (3S+1)th subdecoders, in accordance with values of a second bit group on a lower order side of the input digital signal, and outputting the selected reference voltages as first and second voltages. An interpolation circuit (30) is provided for outputting a voltage obtained by interpolating the first and second voltages received from the decoder (10) with a prescribed interoperation ratio. Though no limitation is imposed on the present invention, in allotting numbers to the plurality of reference voltages, K-th reference voltage Vr(K) changes monotonically for each value of K (1≦K≦3hS+1) and assumes a different voltages for different K. The exemplary embodiments of the present invention will now be described in the bellow.

Figure 1:
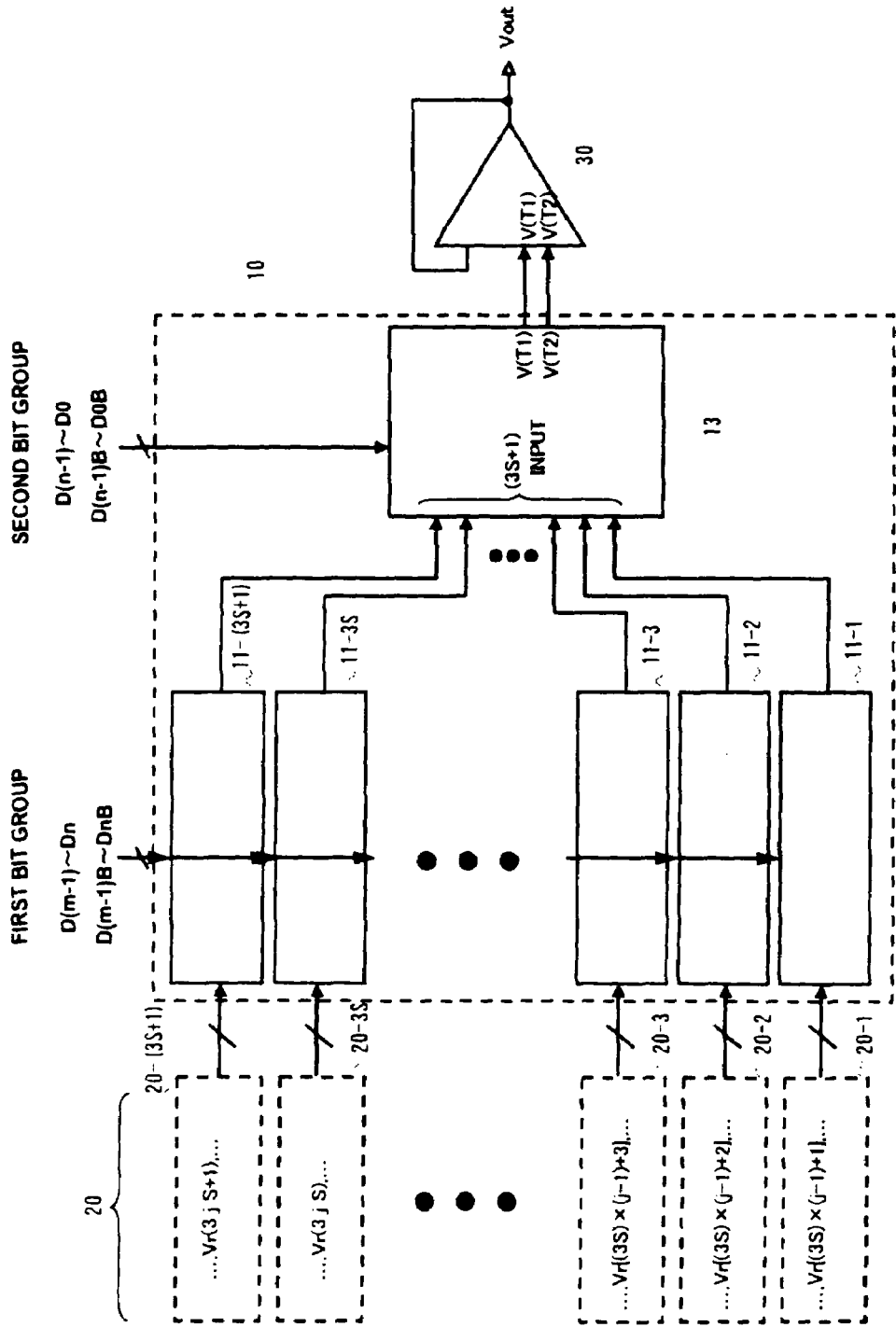
FIG. 1 is a diagram illustrating the configuration of an exemplary embodiment of the present invention.

FIG. 1 is a diagram illustrating the configuration of an exemplary embodiment of the present invention. As shown in FIG. 1, a digital-to-analog converting circuit (DAC) according to this exemplary embodiment comprises a reference voltage family 20, a decoder 10 and an interpolation amplifier 30. The reference voltage family 20 has a plurality of reference voltages that have been divided into (3S+1) reference voltage groups, namely a first reference voltage group 20-1 that includes Vr[3S×(j−1)+1], a second reference voltage group 20-2 that includes Vr[3S×(j−1)+2], up to a (3S+1)th reference voltage group 20-(3S+1) that includes Vr[3S×(j−1)+(3S+1)]. The decoder 10 has first to (3S+1)th subdecoders 11-1 to 11-(3S+1) each of which is able to select one reference voltage from corresponding one of the first to (3S+1)th reference voltage groups in accordance with values of a first bit group [D(m−1) to Dn, D(m−1)B to DnB] out of m bits; and a subdecoder 13 for selecting two voltages V(T1) and V(T2), inclusive of redundant selection of the same reference voltage, out of reference voltages, the number of which is less than or equal to (3S+1), selected by the first to (3S+1)th subdecoders 11-1 to 11-(3S+1), in accordance with values of a second bit group [D(n−1) to D0, D(n−1)B to D0B] out of m bits, and outputting the selected reference voltages. The interpolation amplifier 30 outputs a voltage level obtained by interpolating two voltages V(T1) and V(T2) inclusive of a case where V(T1)=V(T2).

The first to (3S+1)th subdecoders 11-1 to 11-(3S+1) receive in common the first bit group [D(m−1) to Dn, D(m−

1)B to DnB] as an input, and the (3S+1) or less reference voltages selected by these subdecoders 11-1 to 11-(3S+1) become different adjacent voltages in continuous order in the reference voltage family. For example, if reference voltage Vr[(3S)×(j−1)+1] has been selected by the first subdecoder 11-1, then reference voltage Vr[(3S)×(j−1)+2] is selected by the second subdecoder 11-2, reference voltage Vr[(3S)×(j−1)+3] is selected by the third subdecoder 11-3, and reference voltage Vr[(3S)×(j−1)+(3S+1)]=Vr[(3S)×j+1] is selected by the (3S+1)th subdecoder 11-(3S+1). It should be noted in FIG. 1 that true signal and bar signal (complementary signal) of the bit signal of the first and second bit groups is expressed by Dx and DxB where x=(m−1) to 0.

Figure 21:
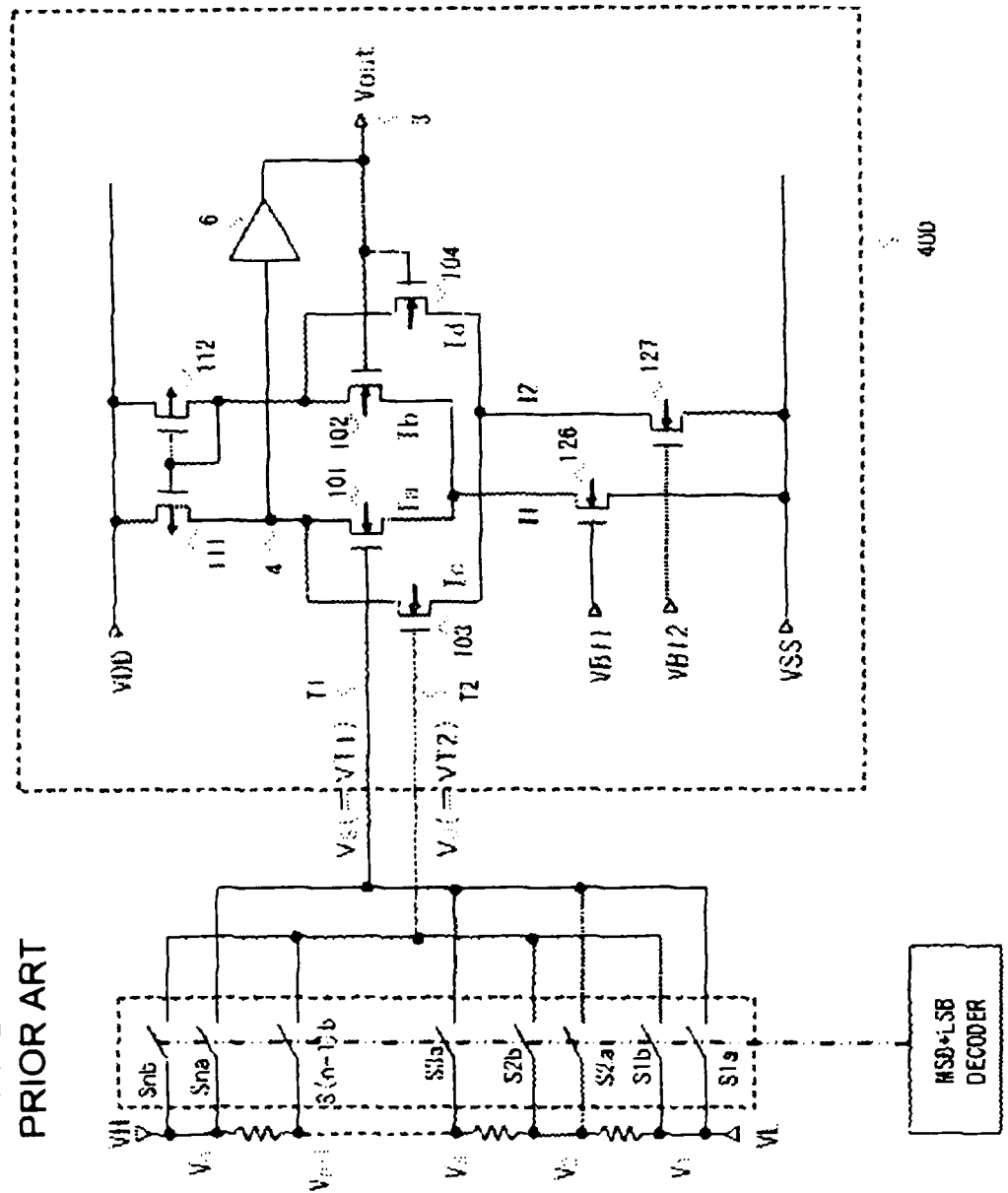
FIG. 21 is a diagram illustrating the configuration of related art (Patent Document 3)

FIG. 2A is a diagram for describing the specifications of a DAC that selects and outputs 256 voltage levels in accordance with 8-bit data (m=8) in the exemplary embodiment of FIG. 1. Use will be made of the conversion specifications described above with reference to FIG. 22. In FIG. 2B illustrating the interpolation amplifier 30, it is possible to apply any interpolation circuit that subjects the two voltages V(T1) and V(T2) to 1:1 interpolation {Vout=[V(T1)+V(T2)]/2}. For example, the differential amplifier 400 of FIG. 21 which have two input terminals T1 and T2 and interpolates the voltage V(T1) and V(T2) with an interpolation ratio 1:1, or any amplifier having the same function can be used. Such an interpolation circuit that receives V(T1) and V(T2) at an input terminal at different times and interpolates the voltage V(T1) and V(T2) with an interpolation ratio 1:1 may be used. An example using the interpolation circuit having two input terminals T1 and T2 will be described in the below.

FIG. 2A is a diagram illustrating an example of a method of selecting the two input voltages V(T1) and V(T2) supplied to the interpolation amplifier 30 shown in FIG. 2B. FIG. 2A shows the corresponding relationship among output levels corresponding to 8-bit data D7 to D0, reference voltages (Vref), two voltage V(T1) and V(T2) selected by the decoder 10 and the 8-bit data D7 to D0. Specifically, FIG. 2A illustrates, in tabular form, the correspondence among 256 output levels, reference voltages Vr1 to Vr97 and two voltages. The combination of the two voltages can be swapped with respect to the voltages V(T1) and V(T2).

As illustrated in FIG. 2A, only 97 voltages, which are less than half the output voltages of 256 levels, are provided as the voltages that are supplied to the interpolation amplifier 30.

If we assume that output voltages of eight levels constitute one section, then the conversion specifications per eight levels will be the same as those in FIG. 22. For example, the eight levels of levels 0 to 7 are made outputs corresponding to data (D7, D6, D5, D4, D3, D2, D1, D0)=(0,0,0,0,0,0,0,0) to (0,0,0,0,0,1,1,1), and the combinations of two voltages [V(T1), VT(2)] that are supplied to the interpolation amplifier 30 with respect to these eight levels employ reference voltages Vr1, Vr2, Vr3, and Vr4. The reference voltages Vr1, Vr2, and Vr3 have been set to levels 0, 2, and 6, respectively, within this section, and the reference voltage Vr4 has been set to the initial level (level 8) in the next section. That is, there is a potential difference equivalent to two levels between Vr1 and Vr2 and between Vr3 and Vr4, and there is a potential difference equivalent to four levels between Vr2 and Vr3. The combinations of two voltages based upon the four reference voltages Vr1, Vr2, Vr3, and Vr4 are as follows:

[V(T1), V(T2)]: (Vr1, Vr1), (Vr2, Vr1), (Vr2, Vr2), (Vr3, Vr1), (Vr3, Vr2), (Vr4, Vr2), (Vr3, Vr3), (Vr4, Vr3).

As a result, it is possible to obtain a linear output of the following eight levels from the output of the interpolation amplifier 30 in FIG. 2B:

level 0=(Vr1+Vr1)/2;
level 1=(Vr2+Vr1)/2;
level 2=(Vr2+Vr2)/2;
level 3=(Vr3+Vr1)/2;
level 4=(Vr3+Vr2)/2;
level 5=(Vr4+Vr2)/2;
level 6=(Vr3+Vr3)/2; and
level 7=(Vr4+Vr3)/2.

Although it is possible for the combinations of the two voltages supplied to the interpolation amplifier 30 at level 4 to be two in number, namely the combination of voltages Vr2 and Vr3 and the combination of voltages Vr1 and Vr4, this exemplary embodiment will be described taking the combination of voltages Vr2 and Vr3 as an example.

Similarly, the eight levels of levels 8 to 15 in the next section are made outputs corresponding to data (D7, D6, D5, D4, D3, D2, D1, D0)=(0,0,0,0,1,0,0,0) to (0,0,0,0,1,1,1,1), and the combinations of two voltages [VT(1), V(T2)] that are supplied to interpolation amplifier 30 with respect to these eight levels employ reference voltages Vr4, Vr5, Vr6 and Vr7. The reference voltages Vr4, Vr5 and Vr6 have been set to levels 8, 10 and 14, respectively, within this section, and the reference voltage Vr7 has been set to the initial level (level 16) in the next section. It is possible to obtain a linear output of the following eight levels from the output of the interpolation amplifier 30 in FIG. 2B:

level 8=(Vr4+Vr4)/2;
level 9=(Vr5+Vr4)/2;
level 10=(Vr5+Vr5)/2;
level 11=(Vr6+Vr4)/2;
level 12=(Vr6+Vr5)/2;
level 13=(Vr7+Vr5)/2;
level 14=(Vr6+Vr6)/2; and
level 15=(Vr7+Vr6)/2.

Similarly, the eight levels of levels 248 to 255 in the last section are made outputs corresponding to data (D7, D6, D5, D4, D3, D2, D1, D0)=(1,1,1,1,1,0,0,0) to (1,1,1,1,1,1,1,1), and the combinations of two voltages [V(T1), V(2)] that are supplied to the interpolation amplifier 30 with respect to these eight levels employ reference voltages Vr94, Vr95, Vr96, Vr97. The reference voltages Vr94, Vr95, and Vr96 have been set to levels 248, 250 and 254, respectively, within this section, and the reference voltage Vr97 has been set to one level (which corresponds to level 256) that is outside this section. It is possible to obtain a linear output of the following eight levels from the output of the interpolation amplifier 30 in FIG. 2B:

level 248=(Vr94+Vr94)/2;
level 249 (Vr95+Vr94)/2;
level 250=(Vr95+Vr95)/2;
level 251=(Vr96+Vr94)/2;
level 252=(Vr96+Vr95)/2;
level 253=(Vr97+Vr95)/2;
level 254=(Vr96+Vr96)/2; and
level 255=(Vr97+Vr96)/2.

Thus, out of the output voltages of the total of 256 levels of levels 0 to 255, the first to eighth levels in each section correspond to respective ones of the items of data (0,0,0) to (1,1,1) of the lower three bits of the digital data (D2, D1, D1). Further, the sections are associated by the 32 combinations of the upper 5 bits (D7, D6, D5, D4, D3). Accordingly, outputs of 32×8=256 levels are possible with regard to the upper 5 bits (D7, D6, D5, D4, D3) and three lower bits (D2, D0, D0). It should be noted that although each section is constituted by eight levels exhibiting linearity in which the voltage differences between levels are equal, the voltage differences between levels can be made different from section to section.

Figure 3:
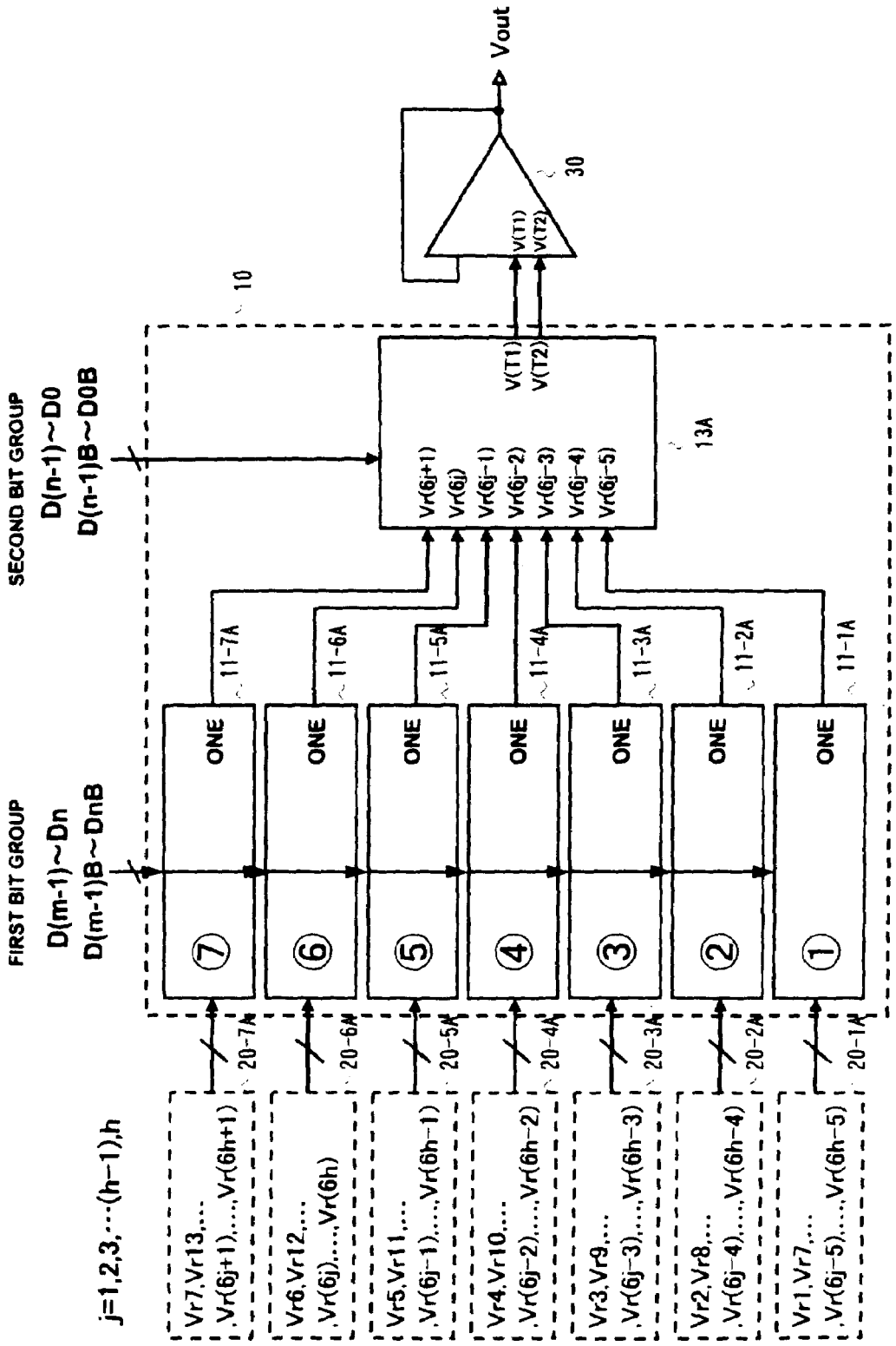
FIG. 3 is a diagram illustrating the configuration of the exemplary embodiment (in a case where S=2 in FIG. 1) of the present invention.

FIG. 3 is a diagram illustrating the configuration of the DAC in a case where S=2 holds in the exemplary embodiment shown in FIG. 1 (2 is equal to 2 raised to the first power, and therefore 3S+1=7 holds). This illustrates a first example of a configuration of FIG. 1 in the exemplary embodiment of FIG. 2. The reference voltages are divided into seven (S=2; 2 is equal to 2 raised to the first power) groups 20-1A to 20-7A.

We will assume that the number m of bits of the input digital signal (the data signal) is 8, that n=4 holds, that the first bit group D(m−1) to Dn of the input digital signal is D7 to D4 and that the second bit group D(n−1) to D0 is D3 to D0. The first bit group D7 to D4 and second bit group D3 to D0 are accompanied by complementary signals D7B to D4B and D3B to D0B, respectively.

The 6h+1 reference voltages are grouped into the following groups:

(1) first reference voltage group 20-1A: [Vr1, Vr7, ... , Vr(6j−5), ... , Vr(6h−5)];

(2) second reference voltage group 20-2A: [Vr2, Vr8, ... , Vr(6j−4), ... , Vr(6h−4)];

(3) third reference voltage group 20-3A: [Vr3, Vr9, ... , Vr(6j−3), ... , Vr(6h−3)];

(4) fourth reference voltage group 20-4A: [Vr4, Vr10, ... , Vr(6j−2), ... , Vr(6h−2)];

(5) fifth reference voltage group 20-5A: [Vr5, Vr11, ... , Vr(6j−1), ... , Vr(6h−1)];

(6) sixth reference voltage group 20-6A: [Vr6, Vr12, ... , Vr(6j), ... , Vr(6h)]; and (7) seventh reference voltage group 20-7A: [Vr7, Vr13, ... , Vr(6j+1), ... , Vr(6h+1)].

There is provided a decoder 10 including seven subdecoders 11-1A to 11-7A, each of which selects and outputs one voltage from the first to seven reference voltage groups 20-1A to 20-7A in accordance with values of the upper four bits (D7 to D4, D7B to D4B), and a decoder 13A for selecting and outputting two voltages [V(T1), V(T2)], inclusive of redundant selection of the same voltage, out of adjacent seven reference voltages [Vr(6j−5) to Vr(6j+1)] in accordance with values of the lower four bits (D3 to D0, D3B to D0B).

The subdecoders 11-1A to 11-7A select seven [i.e., (3S+1), S=2] adjacent reference voltages Vr(6j−5), Vr(6j−4), Vr(6j−3), Vr(6j−2), Vr(6j−1), Vr(6j), Vr(6j+1) from the first to seventh reference voltage groups 20-1A to 20-7A in accordance with the values of the upper four bits (D7 to D4, F7B to D4B). If, in the example shown in FIG. 3, the upper four bits (D7, D6, D5, D4) of the first bit group are (0,0,0,0), then the subdecoders 11-1A to 11-7A select seven reference voltages Vr1, Vr2, Vr3, Vr4, Vr5, Vr6, and Vr7 from the first to seventh reference voltage groups 20-1A to 20-7A. That is, owing to the upper four bits D7 to D4 among the bits D7 to D0 in FIG. 2A, the subdecoders 11-1A to 11-7A select seven corresponding adjacent reference voltages, with output voltages of 16 consecutive levels (two sections) serving as the unit.

From the seven reference voltages that have been selected by the subdecoders 11-1A to 11-7A, the subdecoder 13A selects four adjacent reference voltages in accordance with the value of D3, D3B in the lower four bits (D3 to D0, D3B to D0B), after which it selects two reference voltages as the voltages [V(T1), V(T2)], inclusive of redundant selection of the same reference voltage, in accordance with the values of (D2 to D0, D2B to D0B). An output voltage level corresponding to the two selected voltages [V(T1), V(T2)] is then output by the interpolation amplifier 30. In the example shown in FIG. 3, if D3 is 0 (D3B is 1), the subdecoder 13A, based upon the lower three bits (D2 to D0, D2B to D0B), selects two voltages V(T1) and V(T2) out of reference voltages Vr1, Vr2, Vr3, and Vr4 from among the seven adjacent reference voltages selected by the subdecoders 11-1A to 11-7A, e.g., Vr1, Vr2, Vr3, Vr4, Vr5, Vr6, and Vr7. On the other hand, if D3 is 1, then the subdecoder 13A selects two voltages V(T1) and V(T2) out of reference voltages Vr4, Vr5, Vr6 and Vr7 based upon the lower three bits (D2, D1, D0). That is, based upon D3 out of the lower four bits (D3, D2, D1, D0) in D7 to D0 of FIG. 2A, the subdecoder 13A selects four reference voltages corresponding to either the eight levels (one section) of the first half (lower-level side) or the eight levels (one section) of the latter half (higher-level side) of the output voltages of 16 levels (two sections), and, based upon the lower three bits (D2, D1, D0), selects two reference voltages as voltages V(T1) and V(T2), inclusive of redundant selection of the same reference voltage, out of the four reference voltages selected by D3. The interpolation amplifier 30 receives the two voltages V(T1) and V(T2) selected by the subdecoder 13A and outputs one of the levels 0 to 255.

Figure 4:
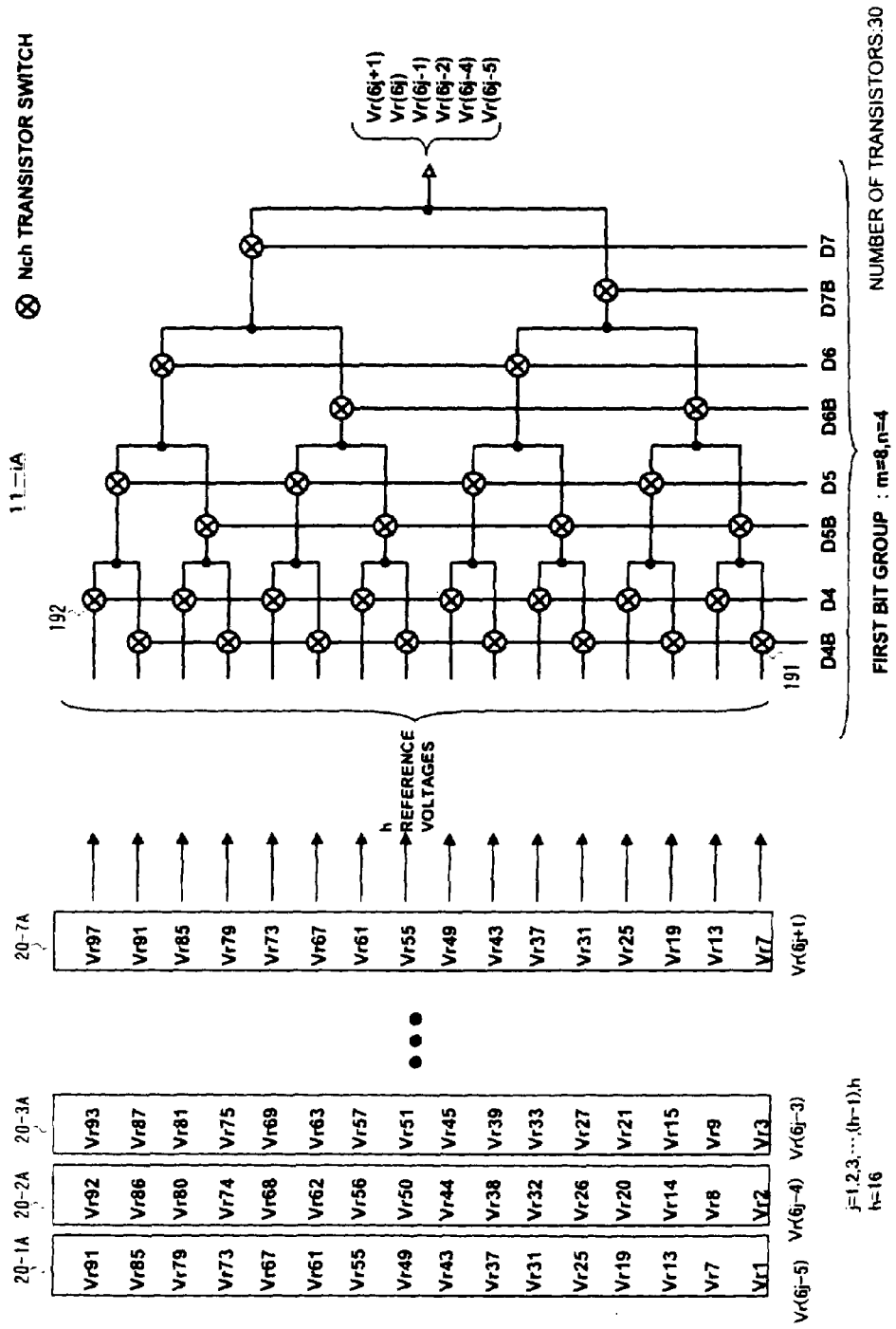
FIG. 4 is a diagram illustrating an example of the configuration of subdecoder 11-$i$A (I=1-7) in FIG. 3.

FIG. 4 is a diagram illustrating an example of the configuration of the subdecoders 11-1A to 11-7A in FIG. 3. Based upon the upper four bits (D7 to, D4, D7B to D4B), 16 reference voltages are selected successively from the side of the lower bits (D4, D4B) to the side of the upper bits (D7, D7B). For the sake of illustration in the drawing, the arrangement shown in FIG. 4 is such that h (=16) reference voltages are input to one subdecoder 11-iA with seven reference voltages being adopted as one set. However, seven of the subdecoders 11-iA (i=1 to 7) of FIG. 4 (the first to seventh subdecoders 11-1A to 11-7A of FIG. 3) are provided in correspondence with respective ones of the first reference voltage group 20-1A (Vr1, Vr7, ... , Vr85, Vr91), the second reference voltage group 20-2A (Vr2, Vr8, ... , Vr86, Vr92), the third reference voltage group 20-3A (Vr3, Vr9, ... , Vr87, Vr93), ... , and the seventh reference voltage group 20-7A (Vr7, Vr13, ... , Vr91, Vr97). These seven subdecoders 11-1A to 11-7A output respective ones of seven adjacent reference voltages Vr(6j−5), Vr(6j−4), Vr(6j−3), Vr(6j−2), Vr(6j−1), Vr(6j), Vr(6j+1) (where j=1, 2, ... , h).

One of two successive reference voltages in each of the pairs (Vr1, Vr7), (Vr13, Vr19), ... and (Vr73, Vr79) in the first reference voltage group 20-1A is selected by N-channel transistor switches connected to respective ones of lower bits (D4, D4B) of the first bit group. One of the two reference voltages that have been selected by the N-channel transistor switches connected to respective ones of the bits (D4, D4B) is selected by N-channel transistor switches connected to respective ones of upper bits (D5, D5B). Thereafter, and in similar fashion, one of two reference voltages that have been selected by N-channel transistor switches connected to lower bits is selected by upper bits. Finally, N-channel transistor switches connected to bits (D7, D7B) select and output one reference voltage Vr(6j−5) of two reference voltages that have been selected by N-channel transistor switches connected to bits (D6, D6B) that are one order lower. Similarly, the second to seventh subdecoders (second to seventh subdecoders 11-2A to 11-7A of FIG. 3) select and output Vr(6j−4), Vr(6j−3), Vr(6j−2), Vr(6j−1), Vr(6j), and Vr(6j+1) based upon the first bit group (D7 to D4, D7B to D4B).

The number of transistor switches in each subdecoder 11-iA in FIG. 4 is 30, and therefore the total number of transistor switches in the seven subdecoders 11-1A to 11-7A is 210.

In this embodiment, since the subdecoders 11-iA to 11-7A have tournament-type configuration which select h (16) reference voltages from a lower bit side (D4, D4B) to a upper bit side (D7, D7B) in accordance with the upper four bits (D4, D4B) to (D7, D7B), wiring intersections of the kind found in Patent Document 1 (decoder 116 in FIG. 18) do not occur. It should be noted that the switches in the subdecoder 11-iA of FIG. 4 may just as well be composed of P-channel transistors. In this case, the subdecoder 11-iA may be configured by changing the polarities of the transistors from N-channel to P-channel and interchanging the true and bar signals of the bit signal such as bar signal D4B and true signal D4. Therefore, in the embodiments described below, only sundecoder using N-channel transistors may be illustrated and the configuration using P-channel transistors is omitted.

Figure 5:
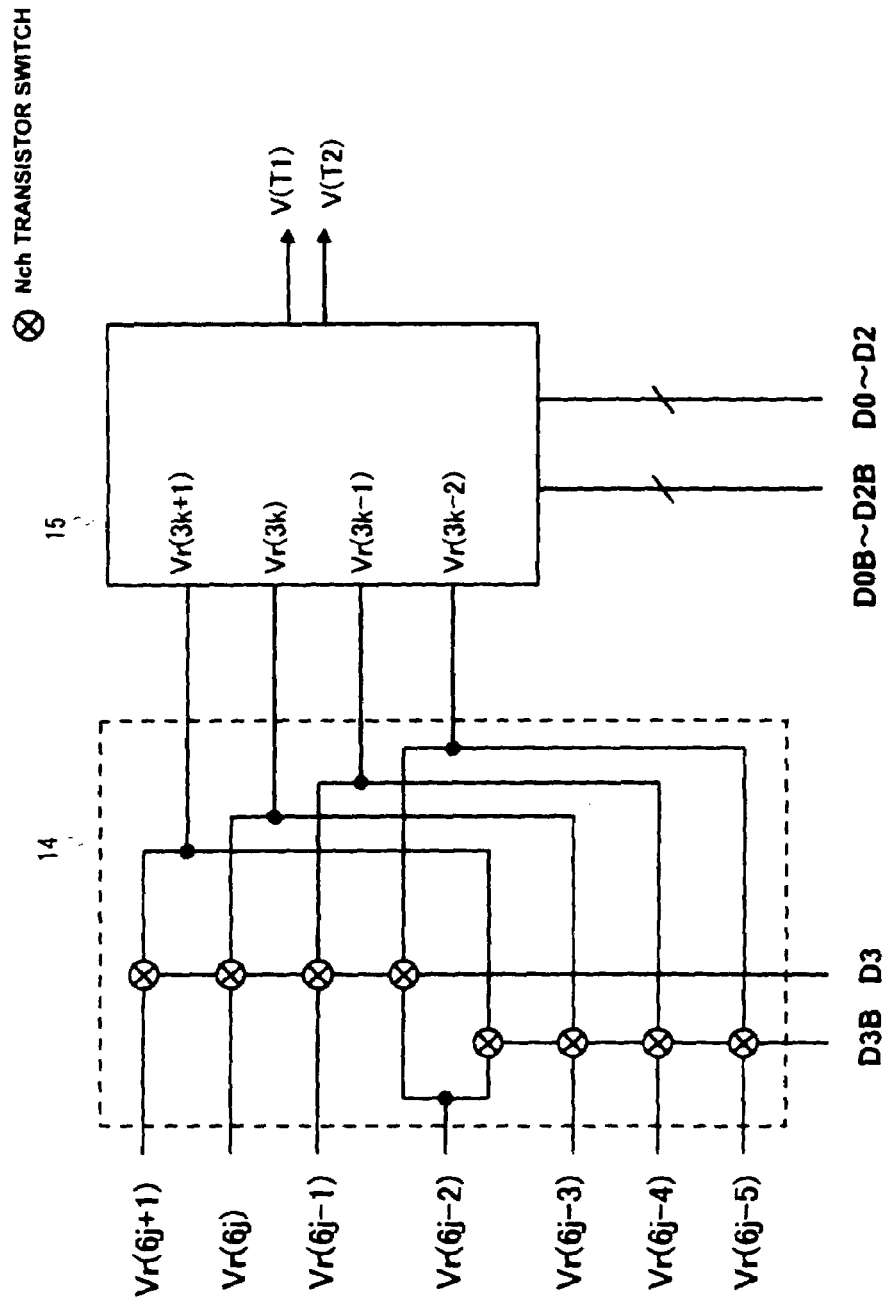
FIG. 5 is a diagram illustrating the configuration of subdecoder 13A (14) in FIG. 3.

FIG. 5 is a diagram illustrating an example of the configuration of subdecoder 13A in FIG. 3. The subdecoder 13A of FIG. 5 is so adapted that when the second bit group (lower order n bits) exceeds three bits, decoding is performed (by a subdecoder 14) based upon the upper bits that have exceeded the lower three bits, after which decoding is performed (by a subdecoder 15) based upon the lower three bits. The sundecoder 14 selects adjacent four reference voltages out of (3S+1) reference voltages selected by the sundecoders 11-1A to 11-7A which correspond to the first to (3S+1)th sundecoders in FIG. 3. An example in which n=4 holds is illustrated in FIG. 5. The second bit group (D(n−1) to D0, D(n−1)B to D0B) includes the bit D3, D3B of order higher than the lower three bits (D2 to D0, D2B to D0B). The subdecoder 13A is constituted by the subdecoder 14 that decodes based upon D3, D3B and the subdecoder 15 that decodes based upon D2 to D0, D2B to D0B.

In the subdecoder 14 that receives the seven adjacent reference voltages [Vr(6j−5), Vr(6j−4), Vr(6j−3), Vr(6j−2), Vr(6j−1), Vr(6j), Vr(6j+1)] selected by the subdecoders 11-1A to 11-7A of FIG. 3, adjacent four reference voltages Vr(3k−2), Vr(3k−1), Vr(3k) and Vr(3k+1) out of the seven reference voltages are selected by the single upper bits D3, D3B in the second bit group (D3 to D0, D3B to D0B). Further, the subdecoder 15 that follows the subdecoder 14, selects and outputs two voltages V(T1) and V(T2) from the four reference voltages Vr(3k−2), Vr(3k−1), Vr(3k), and Vr(3k+1) by the lower three bits (D to D0, D2B to D0B) in the second bit group (D3 to D0, D3B to D0B).

The subdecoder 14 has N-channel transistor switches (a total of eight) turned on and off by D3 and D3B. When D3 is 0 (when D3B is 1), the subdecoder 14 selects four reference voltages from the first half (lower-level side) of the seven reference voltages [Vr(6j−5) to Vr(6j+1)] that have been selected by the subdecoders 11-1A to 11-7A, namely reference voltages Vr(6j−5), Vr(6j−4), Vr(6j−3) and Vr(6j−2), and supplies these four reference voltages to the subdecoder 15 as Vr(3k−2), Vr(3k−1), Vr(3k) and Vr(3k+1) (at this time, k=2j−1). Further, when D3 is 1, the subdecoder 14 selects four reference voltages Vr(6j−2), Vr(6j−1), Vr(6j) and Vr(6j+1) from the latter half (higher-level side) of the seven reference voltages [Vr(6j−5) to Vr(6j+1)] that have been selected by the subdecoders 11-1A to 11-7A, and supplies these four reference voltages to the subdecoder 15 as Vr(3k−2), Vr(3k−1), Vr(3k) and Vr(3k+1) (at this time, k=2j). The reference voltage Vr(6j−2) is selected redundantly by the first half (lower-level side) and latter half (higher-level side). It should be noted that the switches of the subdecoder 14 in FIG. 5 may just as well be composed of P-channel transistors. In such case, as with the sundecoder 11-iA of FIG. 4, the polarities of the transistors and complementary signals [e.g., (D3B, D3)] would be interchanged.

Figure 6:
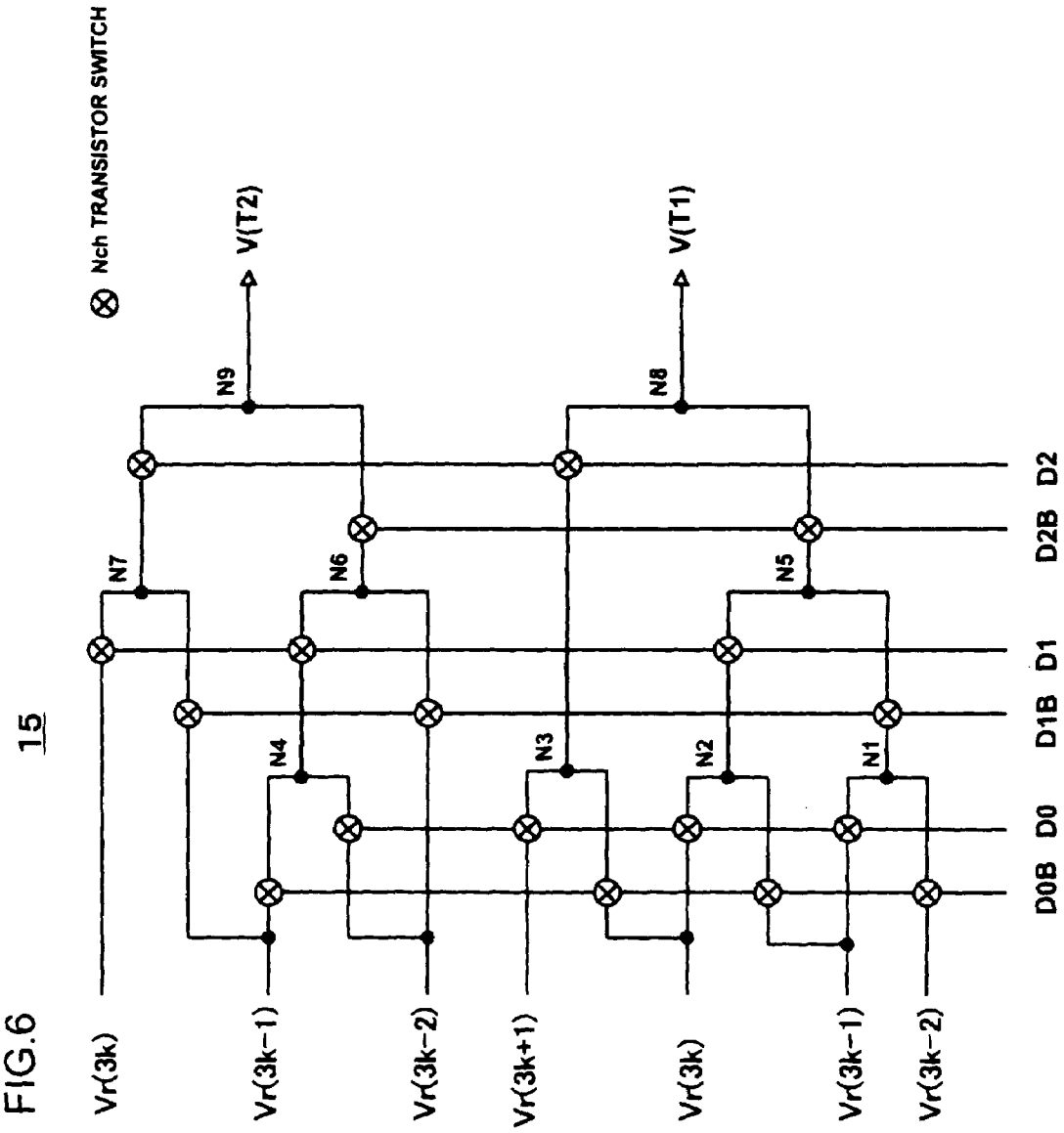
FIG. 6 is a diagram illustrating another example of the configuration of subdecoder 15 in FIG. 5 and FIG. 7.

FIG. 6 is a diagram illustrating an example of the configuration of the subdecoder 15 in FIG. 5. N-channel transistor switches connected to (D0B, D0) select one from each of the pairs [Vr(3k−2), Vr(3k−1)], [Vr(3k−1), Vr(3k)], and [Vr(3k), Vr(3k+1)] and output the selected reference voltages to respective ones of nodes N1, N2 and N3. Further, N-channel transistor switches connected to (D0B, D0) select one of the reference voltages [(Vr(3k−1), Vr(3k)] and output the selected reference voltage to a node N4.

N-channel transistor switches connected to (D1B, D1) select one of the nodes N1 and N2 and output the result to a node N5. N-channel transistor switches connected to (D1B, D1) select one of Vr(3k−2) and node N4 and output the result to a node N6. N-channel transistor switches connected to (D1B, D1) select one of Vr(3k−1) and Vr(3k) and output the result to a node N7.

N-channel transistor switches connected to (D2B, D2) select one of the nodes N3, N5 and output the result to a node N8. The voltage at node N8 is applied as V(T1). N-channel transistor switches connected to (D2B, D2) select one of the nodes N6, N7 and output V(T2).

For example, if k=1 holds {a case where the upper four bits (D7, D6, D5, D4)=(0,0,0,0), i.e., a case where (Vr1, Vr2, Vr3, Vr4) are input to the subdecoder 15 as [Vr(3k−2), Vr(3k−1), Vr(3k), Vr(3k+1)], respectively,}, we have the following:
[V(T1), V(T2)]=(Vr1, Vr1), if (D2, D1, D0)=(0,0,0);
[V(T1), V(T2)]=(Vr2, Vr1), if (D2, D1, D0)=(0,0,1);
[V(T1), V(T2)]=(Vr2, Vr2), if (D2, D1, D0)=(0,1,0);
[V(T1), V(T2)]=(Vr3, Vr1), if (D2, D1, D0)=(0,1,1);
[V(T1), V(T2)]=(Vr3, Vr2), if (D2, D1, D0)=(1,0,0);
[V(T1), V(T2)]=(Vr4, Vr2), if (D2, D1, D0)=(1,0,1);
[V(T1), V(T2)]=(Vr3, Vr3), if (D2, D1, D0)=(1,1,0); and
[V(T1), V(T2)]=(Vr4, Vr3), if (D2, D1, D0)=(1,1,1).
That is, two reference voltages for outputting levels 0 to 7 of FIG. 2A are supplied as V(T1), V(T2). The total number of N-channel transistor switches in the subdecoder 15 of FIG. 6 is 18. It should be noted that the switches in the subdecoder 15 of FIG. 6 may just as well be composed of P-channel transistors. In such case, the polarities of the transistors and the complementary signals [e.g., (D0B, D0)] would be interchanged.

Although there are wiring intersections between the subdecoders 14 and 15 in FIGS. 5 and 6, the number of such intersections is small and the influence on the area of the layout is minor.

Figure 23:
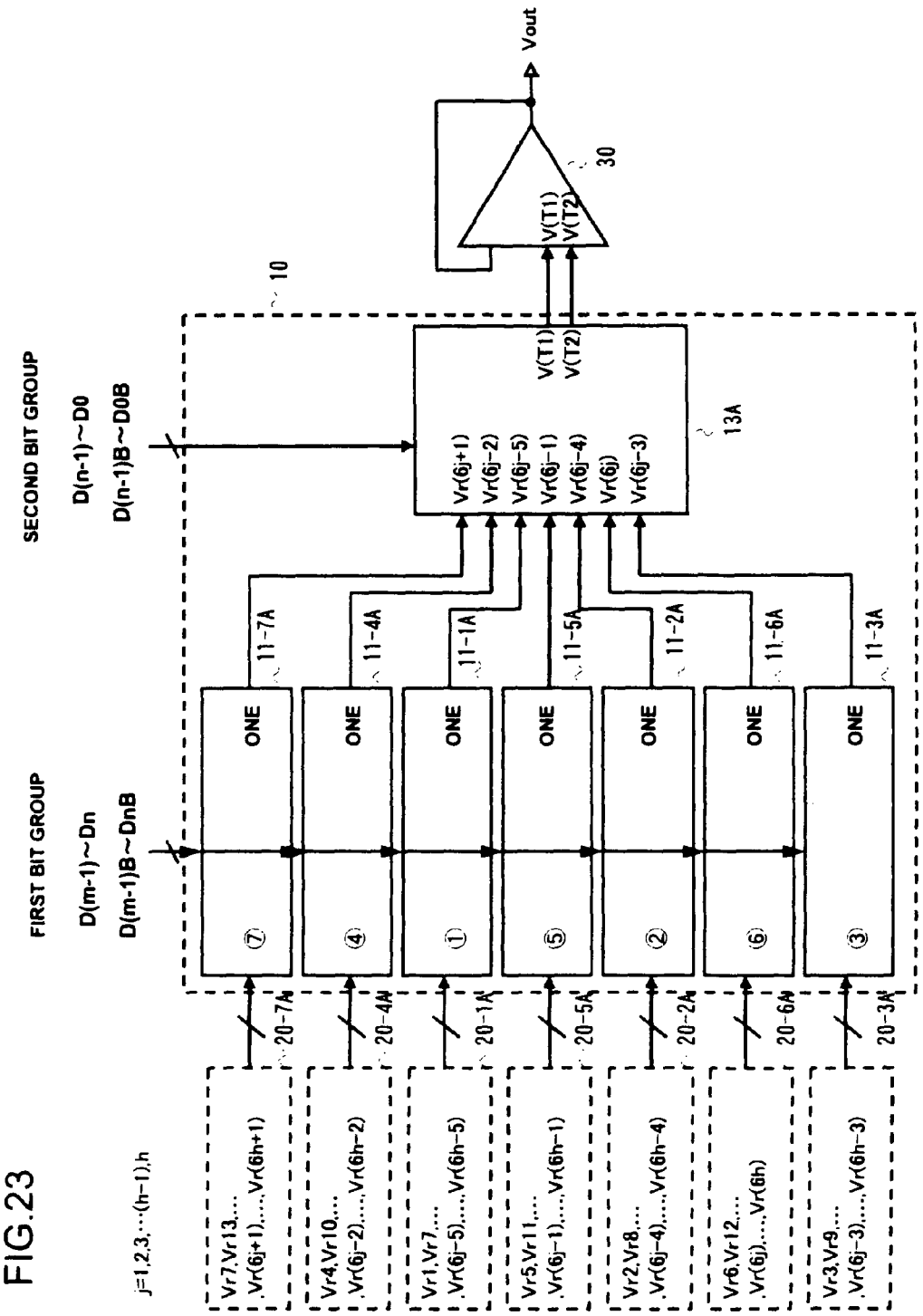
FIG. 23 is a diagram illustrating a modification of FIG. 3.

FIG. 23 is a diagram illustrating a modification of the exemplary embodiment shown in FIG. 3. Although FIG. 23 is equivalent to FIG. 3 in terms of the circuitry, the placement of the reference voltage groups 20-1A to 20-7A and subdecoders 11-1A to 11-7A is changed from that of FIG. 3 in order to reduce the number of wiring intersections in the subdecoder 13 (between the subdecoders 14 and 15) and facilitate the connections between switches.

In FIG. 23, the subdecoder 11-4A is placed adjacent to the subdecoders 11-1A and 11-7A, the subdecoders 11-2A and 11-5A are placed side by side, and the subdecoders 11-3A and 11-6A are placed side by side.

The placement of the reference voltage groups among the first to seventh reference voltage groups 20-1A to 20-7A may also be changed in accordance with the placement of the subdecoders 11-1A to 11-5A. In the example shown in FIG. 23, the reference voltages of each of the groups are extracted from a reference voltage generating circuit (not shown) in the order of reference voltage groups 20-7A, 20-4A, 20-1A, 20-5A, 20-2A, 20-6A and 20-3A in conformity with the order in which the subdecoders 11-7A to 11-3A are arranged, and the reference voltages are connected to respective ones of the corresponding subdecoders.

Figure 24:
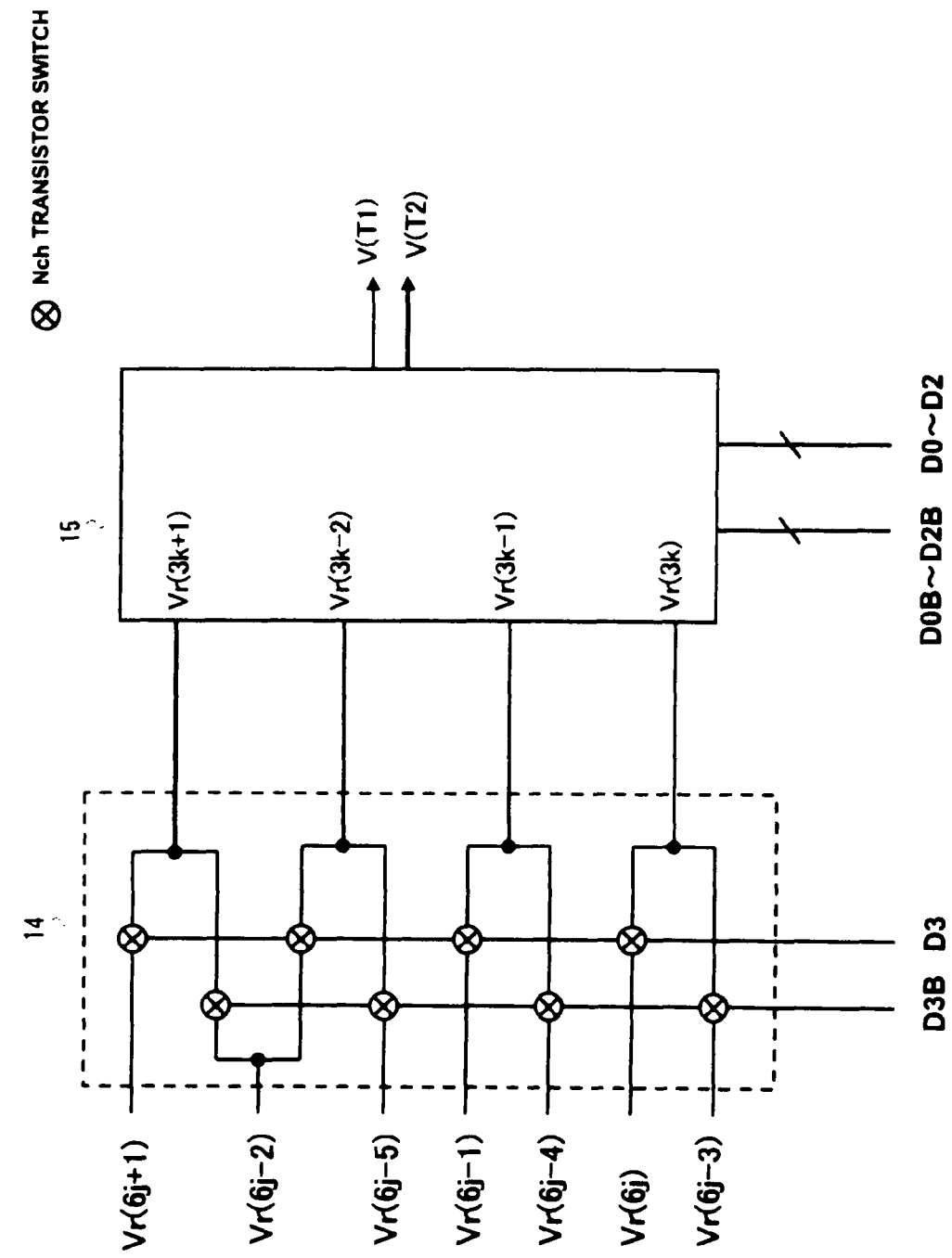
FIG. 24 is a diagram illustrating the configuration of subdecoder 13 (14) in FIG. 23.

FIG. 24 is a diagram illustrating the configuration of the subdecoder 13A in FIG. 23. This is a modification of the exemplary embodiment shown in FIG. 5. The subdecoder 14 in FIG. 24, as with FIG. 5, selects four reference voltages Vr(3k), Vr(3k−1), Vr(3k−2), and Vr(3k+1) in accordance with the values of D3 and D3B out of the seven reference voltages Vr(6j−3), Vr(6j), Vr(6j−4), Vr(6j−1), Vr(6j−5), Vr(6j−2) and Vr(6j+1) selected by the subdecoder 11-3A, 11-

6A, 11-2A, 11-5A, 11-1A, 11-4A, and 11-7A. The arrangement of FIG. 24 has fewer wiring intersections than that of FIG. 5.

Figure 7:
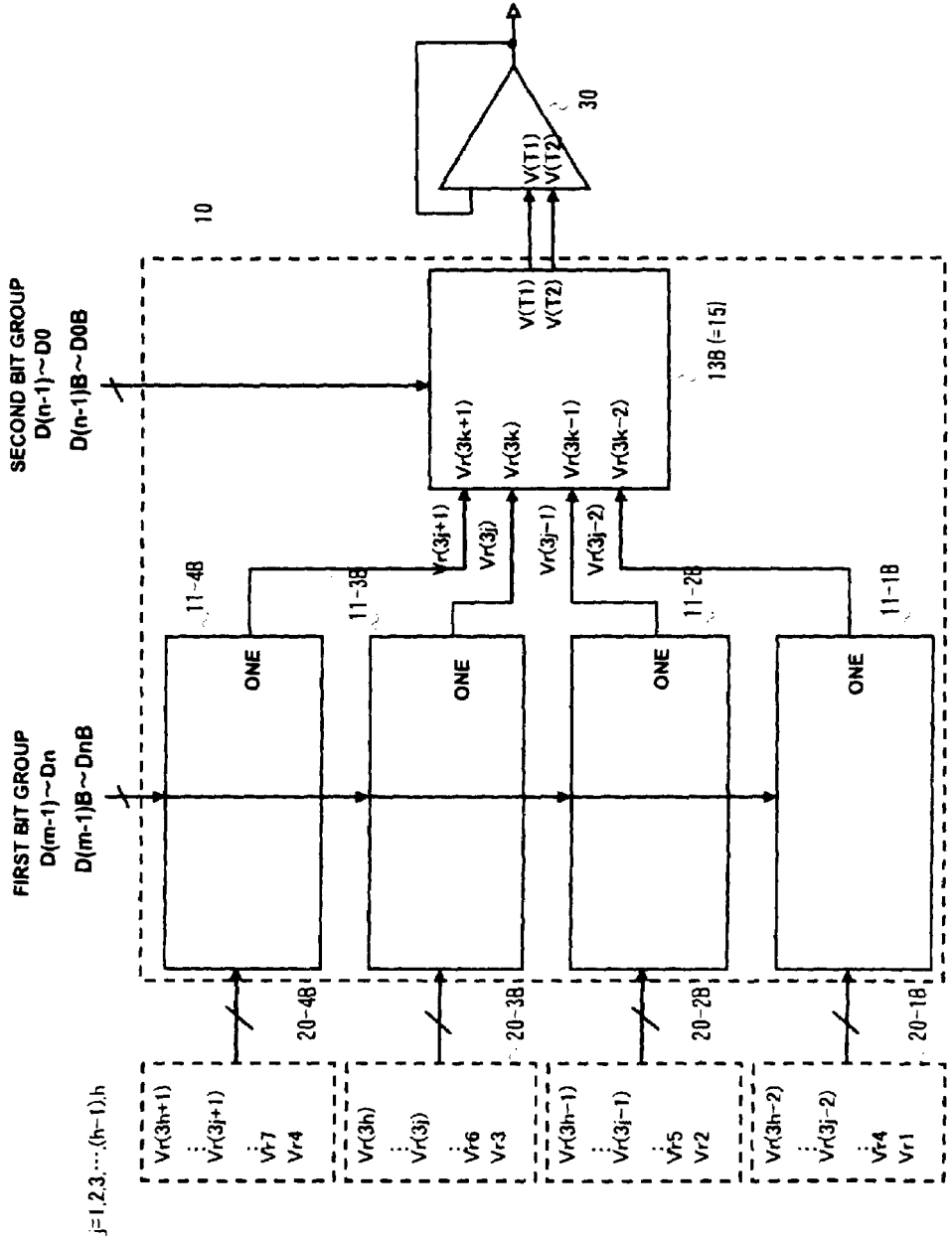
FIG. 7 is a diagram illustrating the configuration of another exemplary embodiment (in a case where S=1 in FIG. 1) according to the present invention.

FIG. 7 is a diagram illustrating the configuration of another exemplary embodiment of the present invention. As shown in FIG. 7, S in the number (3S+1) of reference voltage groups in FIG. 1 is made 1 (zero-th power 0 of 2) in this exemplary embodiment. The reference voltages are divided into four (S=1) groups 20-1B to 20-4B.

We will assume that the number m of bits of the input digital signal is 8, that n=3 holds, that the first bit group D(m−1) to Dn of the input digital signal is D7 to D3 and that the second bit group D(n−1) to D0 is D2 to D0. The first bit group D7 to D3 and second bit group D2 to D0 are accompanied by complementary signals D7B to D3B and D2B to D0B, respectively.

The 3h+1 reference voltages are grouped into the following groups:

(1) first reference voltage group 20-1B: [Vr1, Vr4, ... , Vr(3k−2), ... , Vr(3h−2)];

(2) second reference voltage group 20-2B: [Vr2, Vr5, ... , Vr(3k−1), ... , Vr(3h−1)];

(3) third reference voltage group 20-3B: [Vr3, Vr6, ... , Vr(3k), ... , Vr(3h)]; and (4) fourth reference voltage group 20-4B: [Vr4, Vr7, ... , Vr(3k+1), ... , Vr(3h+1)].

The decoder 10 includes four subdecoders 11-1B to 11-4B for selecting and outputting single voltages [Vr(3j−2) to Vr(3j+1)] in accordance with the first bit group (D7 to D3, D7B to D3B), and a decoder 13B for selecting and outputting two voltages as V(T1) and V(T2), inclusive of redundant selection of the same voltage, out of four adjacent voltages [Vr(3k−2) to Vr(3k+1)] (where index j is replaced by k) in accordance with lower tree bits (D2 to D0, D2B to D0B). It should be noted that subdecoder 13B has the same structure as that of subdecoder 15 in FIG. 6, wherein the second bit group (lower order n bits) is composed of three bits. The amplifier 30 receives V(T1) and V(T2) selected by the subdecoder 13B and outputs [V(T1)+V(T2)]/2.

Figure 8:
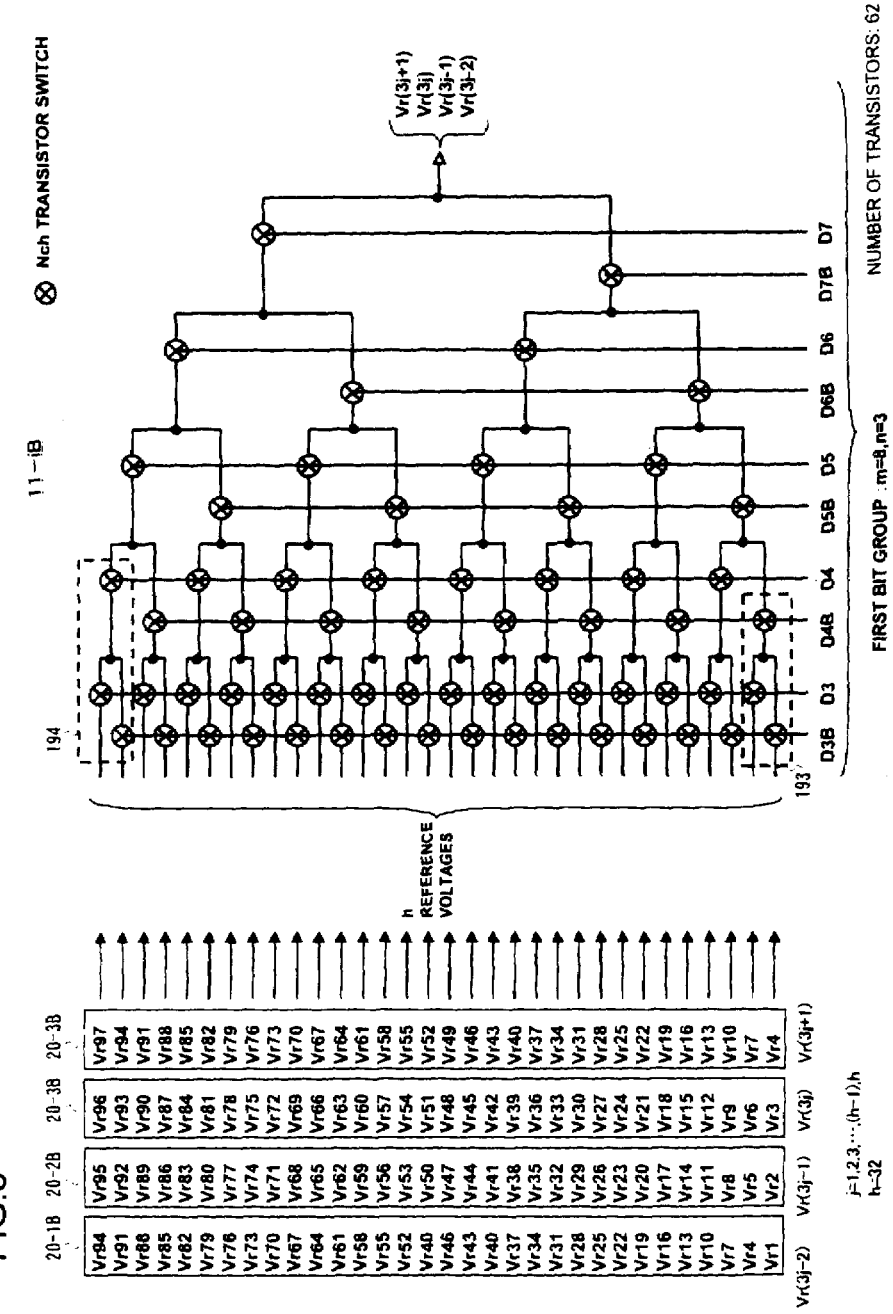
FIG. 8 is a diagram illustrating an example of subdecoder 11-iB (I=1 to 4) in FIG. 7.

FIG. 8 is a diagram illustrating an example of the configuration of the subdecoders 11-1B to 11-4B in FIG. 7. The subdecoders 11-1B to 11-4B have the same configurations when the specifications shown in FIG. 2A are adopted. The sundecoder is designated by 11-iB (I=1 to 4): For the sake of illustration in the drawing, the arrangement shown in FIG. 8 is such that h (=32) reference voltages are supplied to one subdecoder 11-iB with four reference voltages being adopted as one set. However, four of the subdecoders 11-iB of FIG. 8 are provided in correspondence with respective ones of the first reference voltage group 20-1B (Vr1, Vr4, ... , Vr91, Vr94), the second reference voltage group 20-2B (Vr2, Vr5, ... , Vr92, Vr95), the third reference voltage group 20-3B (Vr3, Vr6, ... , Vr93, Vr96) and the fourth reference voltage group 20-4B (Vr4, Vr7, ... , Vr94, Vr97). The first to fourth subdecoders 11-1B to 11-4B output respective ones of reference voltages Vr(3j−2), Vr(3j−1), Vr(3j) and Vr(3j+1).

One of two reference voltages in each of the pairs (Vr1, Vr4), (Vr7, Vr10), ... (Vr85, Vr88), (Vr91, Vr94) in the first reference voltage group 20-1B is selected by N-channel transistor switches connected to respective ones of lower bits (D3, D3B) of the first bit group. One of the two reference voltages that have been selected by the N-channel transistor switches connected to respective ones of the bits (D3, D3B) is selected by N-channel transistor switches connected to respective ones of upper bits (D4, D4B). Thereafter, and in similar fashion, one of two reference voltages that have been selected by N-channel transistor switches connected to lower bits is selected by upper bits. Finally, N-channel transistor switches connected to bits (D7, D7B) select and output one reference voltage Vr(3k−2) of two reference voltages that have been selected by N-channel transistor switches connected to bits (D6, D6B) that are one order lower. Similarly, the second to fourth subdecoders (11-2B to 11-4B of FIG. 7) select and output Vr(3k−1), Vr(3k), Vr(3k+1) based upon the first bit group (D7 to D3, D7B to D3B). In the subdecoder 11-iB, the arrangement is such that based upon the upper 5 bits (D7, D7B) to (D3, D3B), 32 reference voltages are selected successively from the side of the lower bits (D3, D3B) to the side of the upper bits (D7, D7B). The subdecoders 11-1B to 11-4B are identical in structure. Owing to the tournament-type configuration, wiring intersections of the kind found in Patent Document 1 (Japanese Patent Kokai Publication No. JP2000-183747A) shown in FIG. 18 do not occur. It should be noted that the switches in the subdecoder 11-iB of FIG. 8 may just as well be composed of P-channel transistors. In such case, the polarities of the transistors and the complementary signals [e.g., (D3B, D3)] would be interchanged.

The number of transistor switches in each subdecoder 11-iB in FIG. 8 is 62, and therefore the total number of transistor switches in the four subdecoders 11-1B to 11-4B is 248.

FIG. 9 illustrates a list of results obtained by comparing the numbers of switching transistors in the decoders of the exemplary embodiment shown FIGS. 3 and 7. It should be noted that ten bits in FIG. 9 is an estimated value obtained by; expanding eight bits.

The values associated with subdecoders 14 and 15 are the numbers of switching transistors in FIG. 6. The values alongside subdecoder 11 are the numbers of switching transistors obtained by totaling the numbers (3S+1) from FIGS. 4 and 8.

Figure 18:
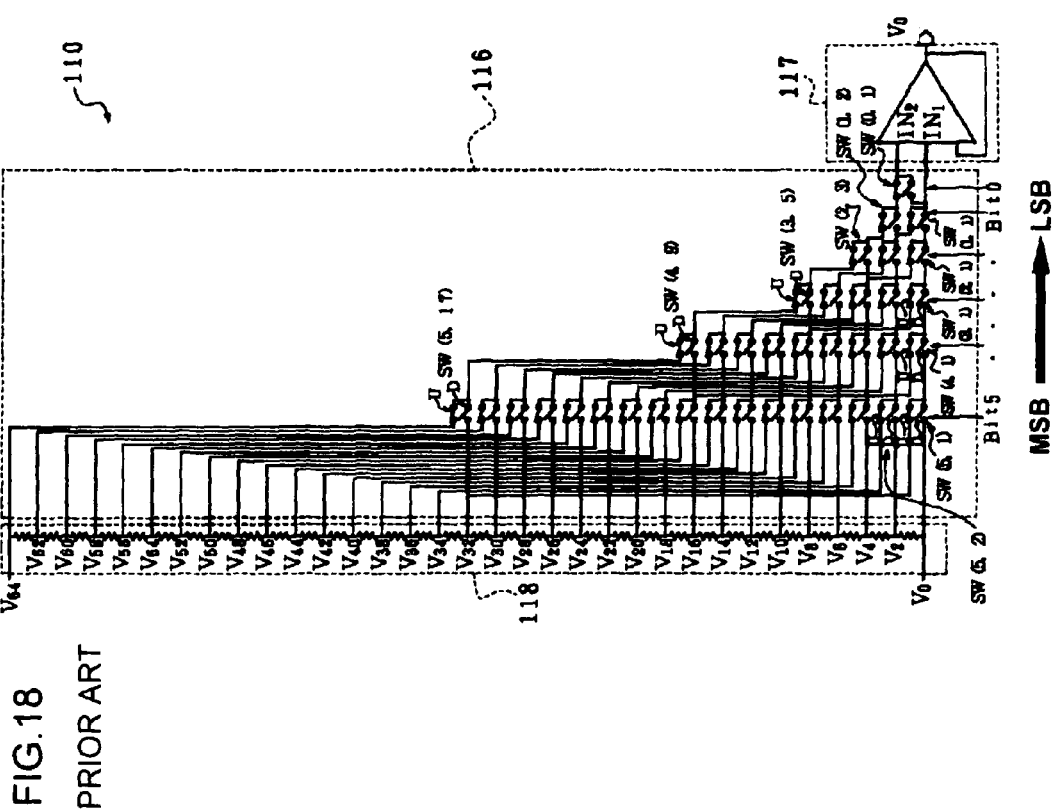
FIG. 18 is a diagram illustrating the configuration of related art (Patent Document 1)
Figure 19:
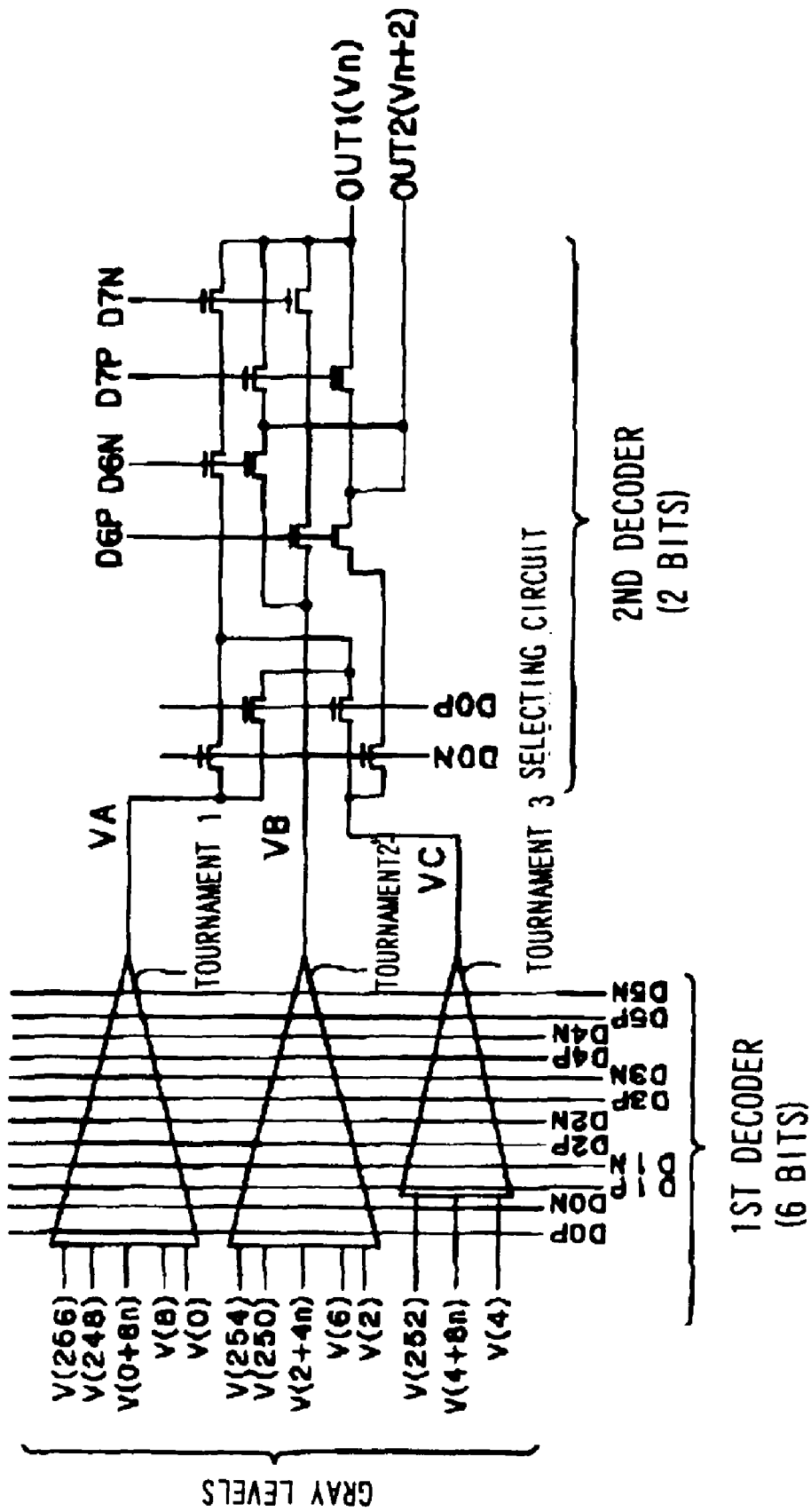
FIG. 19 is a diagram illustrating the configuration of related art (Patent Document 2)

In accordance with the foregoing exemplary embodiment, the number of switching transistors can be reduced in comparison with the decoders of the related art shown in FIGS. 18 to 20. This makes a reduction in area possible.

Further, since the subdecoders 11-iA and 11-iB of the upper bits has a tournament configuration for selecting voltages from the lower order side, as in FIGS. 4 and 8, there is no increase in area ascribable to number of wiring cross points. Although there are wiring intersections in the subdecoder 14 of FIG. 5, the number thereof is small and has no influence upon area.

The larger the number S of divisions, the greater the effect in terms of reducing the number of transistors. The reason for this is a decline in the number of redundant reference voltages [the first reference voltage group and the (3S+1)th reference voltage group]. The desired value for S is on the order of 1(zero-th power of 2), 2 (first power of 2) and 4 (second power of 2). If S is too large, we must take into consideration the fact that there is an increase in the number of wiring intersections in the subdecoder 14.

As for the configuration in case of S=4, although not illustrated, (3S+1) reference voltage groups 20-1 to 20-(3S+1) and the first to (3S+1)th sundecoders 11-1 to 11-(3S+1) in FIG. 1 are divided respectively into 13 items (3S+1=13). In the decoder 10 corresponding to the specifications of FIG. 2A, the bit number m of the input digital signal is 8 and n is 5, the first bit group includes the upper 3 bits D7 to D5, D7B to D5B, and the second bit group includes the lower 5 bits D4 to D0, D4B to D0B, The first to (3S+1)th sundecoders select thirteen adjacent reference voltages, with a unit of continuous 32 levels (4 blocks) of output voltage levels in accordance with the first bit group (D7 to D5, D7B to D5B).

Each of the first to (3S+1)th sundecoders has a tournament type configuration of thee bits, which selects one voltage out of eight reference voltages. The subdecoder 13 selects two voltages V(T1) and V(T2), where it is allowed for V(T1) and V(T2) to have the same voltage, V(T1)=V(T2), in accordance with the second bit group (D4 to D0, D4B to D0B). Referring to FIG. 5, the sundecoder 13 may be composed by the sundecoder 14 which four adjacent reference voltages out of reverence voltages selected by the first to (3S+1) sundecoders in accordance with the upper two bits (D4, D3, D4B, D3B) of the second bit group (D4 to D0, D4B to D0B) and the sundecoder 15 which selects V(T1) and V(T2) out of the four adjacent reference voltages in accordance with the lower three bits (D2 to D0, D2B, to D0B) of the second bit group (D4 to D0, D4B to D0B).

Figure 10:
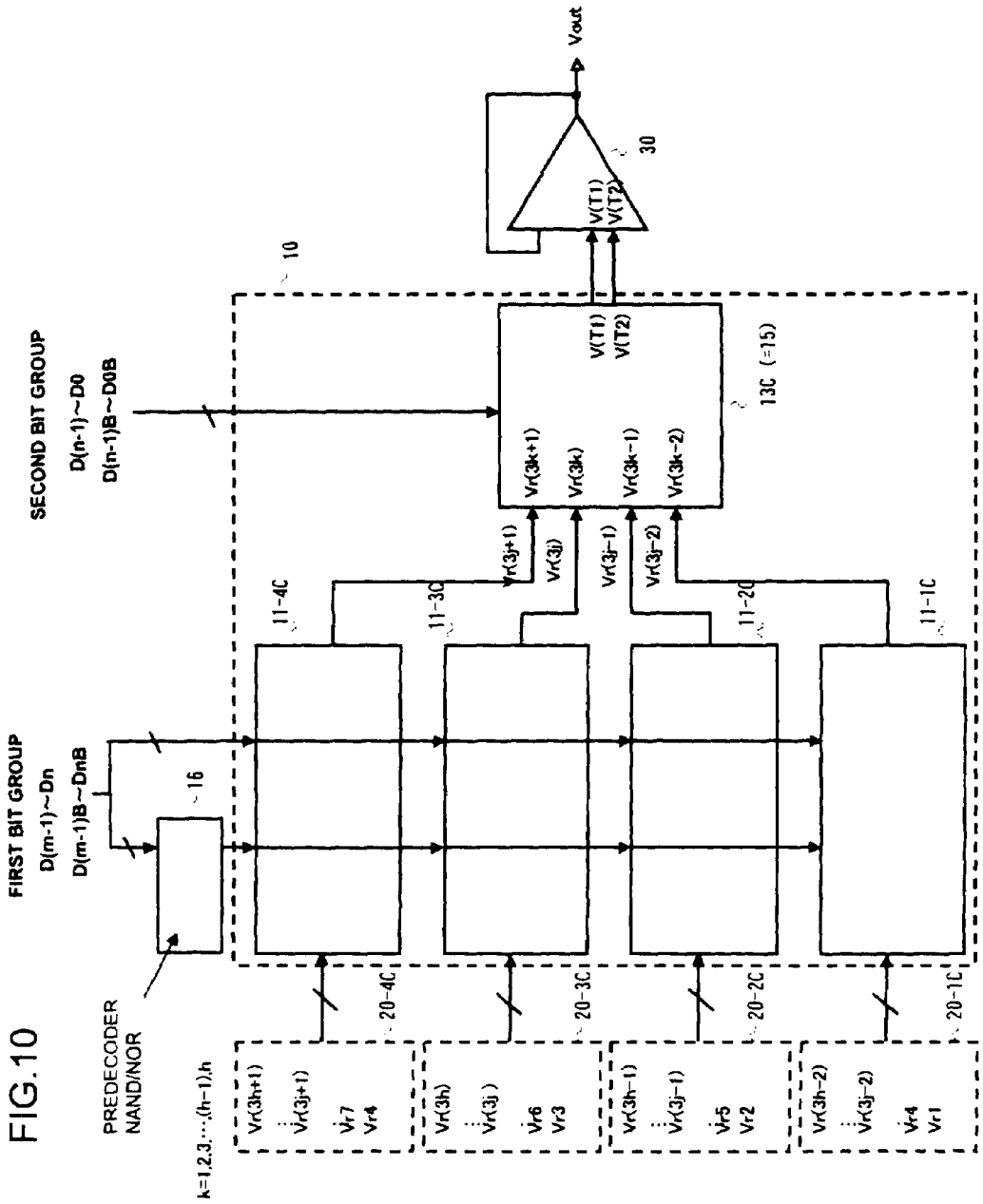
FIG. 10 is a diagram illustrating the configuration of another exemplary embodiment of the present invention.

FIG. 10 is a diagram illustrating the configuration of a second exemplary embodiment of the present invention. In this exemplary embodiment, the number of decoder transistors is reduced by pre-decoding some of the bits of the first bit group D(m−1) to Dn. The number of reference voltages in FIG. 10 is (3h+1) and four reference voltage groups 20-1C, 20-2C, 20-3C, and 20-4C are identical to the reference voltage groups 20-1B, 20-2B, 20-3B, and 20-4B of the exemplary embodiment illustrated in FIG. 7, respectively. In the exemplary embodiment of FIG. 10, some of the bits of the first bit group D(m−1) to Dn in FIG. 7 are pre-decoded by a predecoder 16. IN FIG. 10, the first bit group D(m−1) to Dn and second bit group D(n−1) to D0 are accompanied by complementary signals D(m−1)B to DnB and D(n−1)B to D0B.

First to fourth subdecoders 11-1C to 11-4C to which the first to fourth reference voltage groups 20-1C, 20-2C, 20-3C, and 20-4C, respectively, are supplied are identical in structure and each outputs one voltage from a respective one of the four reference voltage groups 20-1C, 20-2C, 20-3C and 20-4C, based on an output signal of a predecoder 16 which performs operation of the prescribed bit data out of the first bit group and the remaining bit data of the first bit group.

Figure 11:
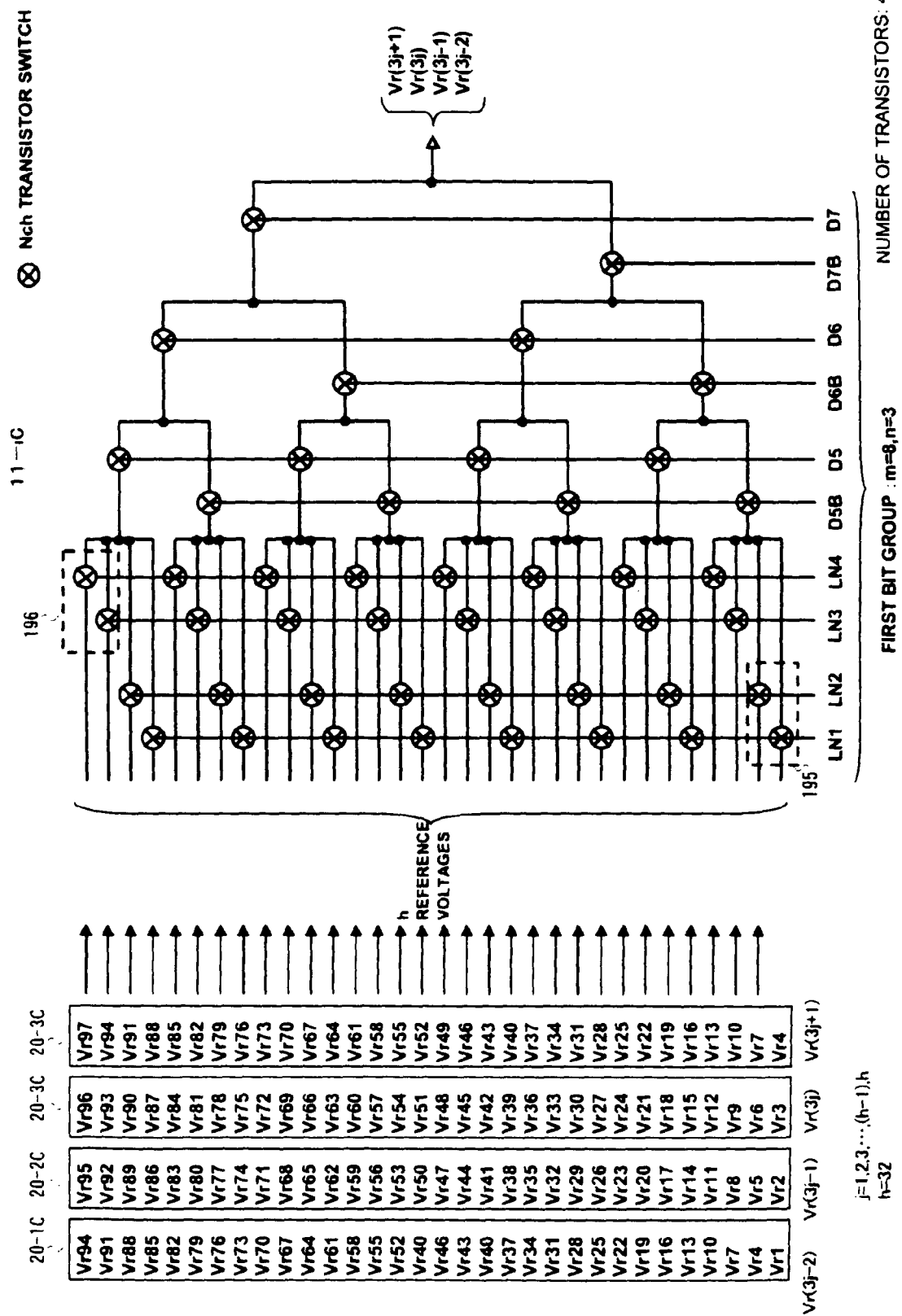
FIG. 11 is a diagram illustrating an example of the configuration and operation of subdecoder 11-iC (i=1 to 4) in FIG. 10.

FIG. 11 is a diagram illustrating an example in which the subdecoders 11-1C to 11-4C of FIG. 10 are constituted by N-channel transistors. In case of the specifications being those of FIG. 2A, the sundecoders 11-1C to 11-4C, which are of the same configuration, are designated by 11-iC (I=1 to 4). As illustrated in FIG. 11, the sundecoder 11-iC is of a tournament type configuration which selects based upon the upper 5 bits (D7 to D3, D7B to D3B), 32 reference voltages successively from the side of the lower bits (D3, D3B) to the side of the upper bits (D7, D7B). The lower 2 bits (D3, D3B, D4, D4B) have been converted to LN1 to LN4 by the predecoder 16 of FIG. 10. As a result, in the sundecoder 11-iC, the number of switching transistors corresponding to the lower 2 bits (D3, D3B) and (D4, D4B) is reduced by one-third.

For the sake of illustration in the drawing, the arrangement shown in FIG. 11 is such that h (=32) reference voltages are supplied to one subdecoder 11-iC with four reference voltage groups being adopted as one set. However, four of the subdecoders 11-iC of FIG. 11 are provided in correspondence with respective ones of the following reference voltage groups:

first reference voltage group 20-1C: (Vr1, Vr4, . . . , Vr91, Vr94);
second reference voltage group 20-2C (Vr2, Vr5, . . . , Vr92, Vr95);
third reference voltage group 20-3C (Vr3, Vr6, . . . , Vr93, Vr96); and
fourth reference voltage group 20-4C (Vr4, Vr7, . . . , Vr94, Vr97).

The first to fourth subdecoders 11-1C to 11-4C output respective ones of reference voltages Vr(3j−2), Vr(3j−1), Vr(3j), Vr(3j+1).

The predecoder 16 receives the two bits of D4, D4B and D3, D3B of the first bit group D(m−1) to Dn (m=8, n=3) as inputs and outputs signals LN1, LN2, LN3 and LN4 of four bits obtained by decoding. In the first subdecoder 11-iC (11-1C of FIG. 10), N-channel transistor switches connected to the outputs (LN1, LN2, LN3, LN4) of predecoder 16 select one reference voltage from each of the sets of four reference voltages (Vr1, Vr4, Vr7, Vr10), (Vr13, Vr16, Vr19, Vr22), . . . , (Vr85, Vr88, Vr91, Vr94) (for a total of eight reference voltages selected). One reference voltage out of each pair of the reference voltages selected by (LN1, LN2, LN3, LN4) is selected by bit signals (D5B, D5) (for a total of four reference voltages selected). One reference voltage out of each of the two pairs of reference voltage selected by (D5B, D5) is selected by bit signals (D6B, D6) (for a total of two reference voltages selected). Finally, one of the two reference voltages selected by (D6B, D6) is selected and output as Vr(3j−2) by bit signals (D7B, D7). Similarly, the second to fourth subdecoders 11 (11-2C to 11-4C of FIG. 10) output Vr(3j−1) to Vr(3j+1). The number of switches in the subdecoder 11-iC of FIG. 11 is 46, and therefore the total number of switches in the four subdecoders 11-1C to 11-4C of FIG. 10 is 184.

Figures 12A, 12B:
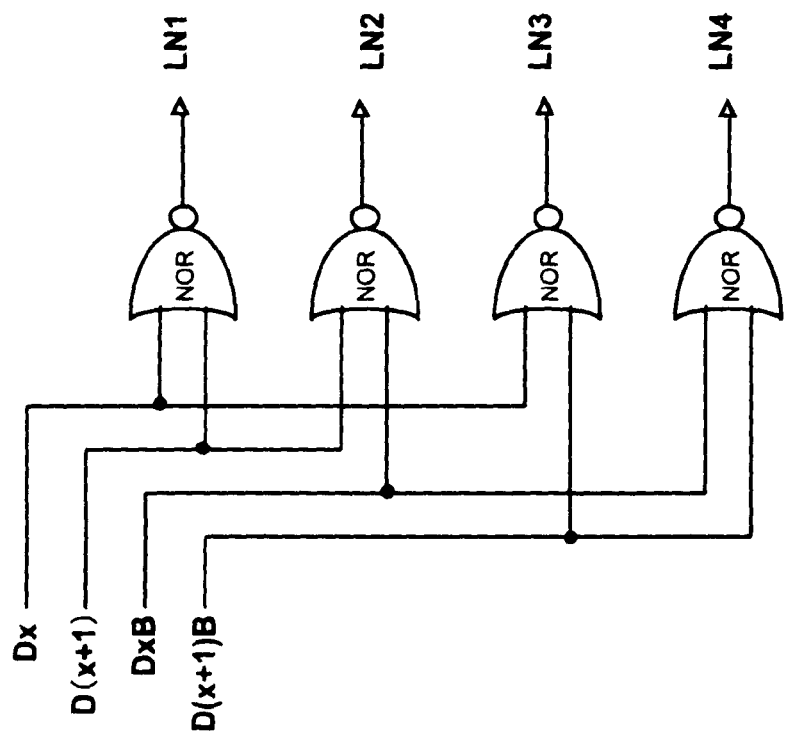
FIGS. 12A and 12B are diagrams illustrating an example of the configuration and operation of predecoder 16 in FIG. 10.

FIG. 12A is a diagram illustrating an example of the configuration of the predecoder 16 of FIG. 10 in a case where the decoder 10 of FIG. 10 is constituted by N-channel transistors. As shown in FIG. 12A, the predecoder 16 includes a NOR gate NOR1 to which D(X+1) and DX are input, a NOR gate NOR2 to which D(X+1), DXB are input, a NOR gate NOR3 to which DX, D(X+1)B are input, and a NOR gate NOR4 to which D(X+1)B, DXB are input. The signals LN1 to LN4 are output from the NOR gates NOR1 to NOR4, respectively. FIG. 12B is a truth table specifying the operation of the predecoder shown in FIG. 12A. As a result of decoding D(X+1) and Dx, those of the bits LN1 to LN4 selected are placed at the high level (1) and the others are placed at the low level (0).

Figures 13A, 13B:
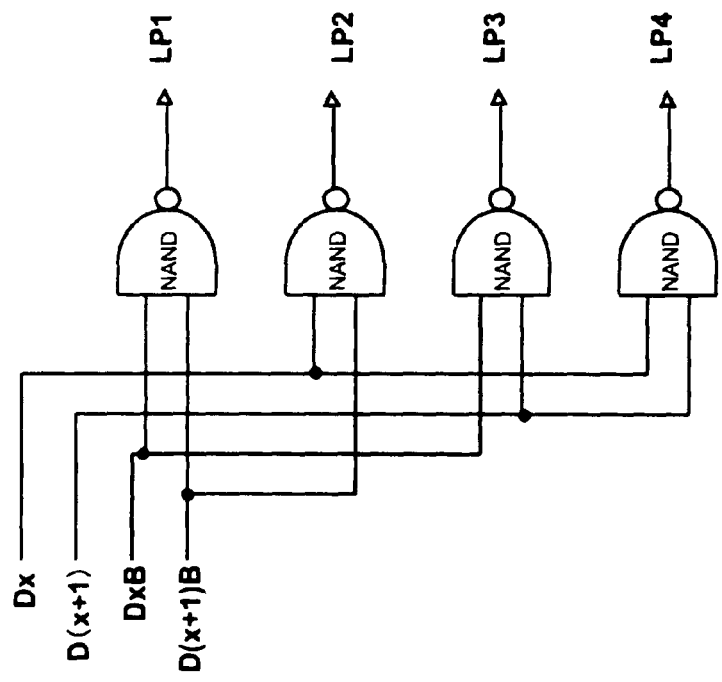
FIGS. 13A and 13B are diagrams illustrating an example of the configuration and operation of predecoder 16 in FIG. 10.

FIG. 13A is a diagram illustrating an example of the configuration of the predecoder 16 of FIG. 10 in a case where the decoder 10 of FIG. 10 is constituted by Pch transistors. The predecoder 16 includes a NAND gate NAND1 to which DXB, D(X+1) are input, a NAND gate NAND2 to which D(X+1)B, DX are input, a NAND gate NAND3 to which DXB and D(X+1) are input, and a NAND gate NAND4 to which D(X+1) and DX are input. Signals LP1 to LP4 are output from the NAND gates NAND1 to NAND4, respectively. FIG. 13B is a truth table illustrating the operation of the predecoder shown in FIG. 13A. As a result of decoding D(X+1) and Dx, those of the bits LP1 to LP4 selected are placed at the low level (0) and the others are placed at the high level (1).

Figure 14:
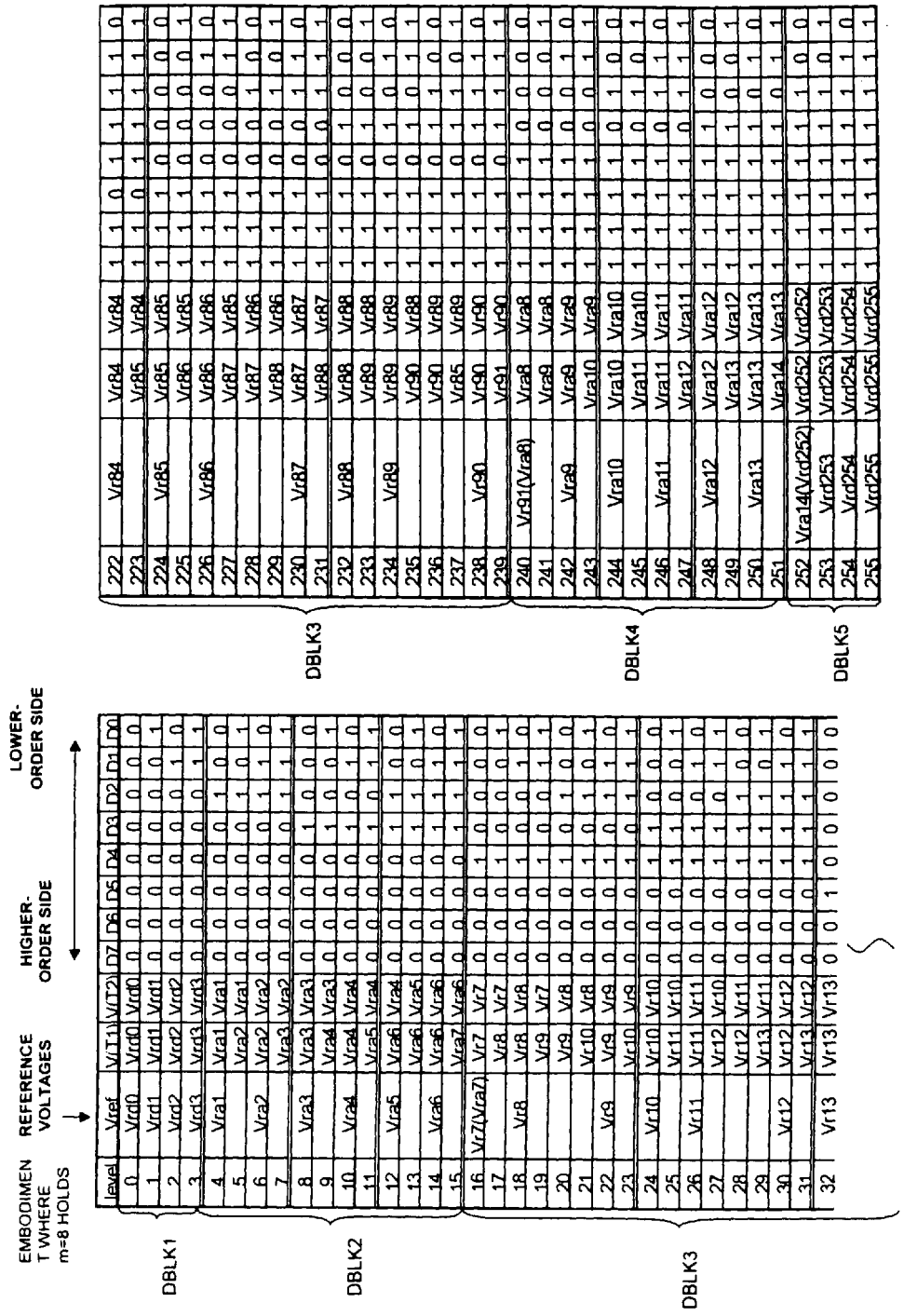
FIG. 14 is a diagram useful in describing the specifications of another exemplary embodiment of the present invention.
Figure 15:
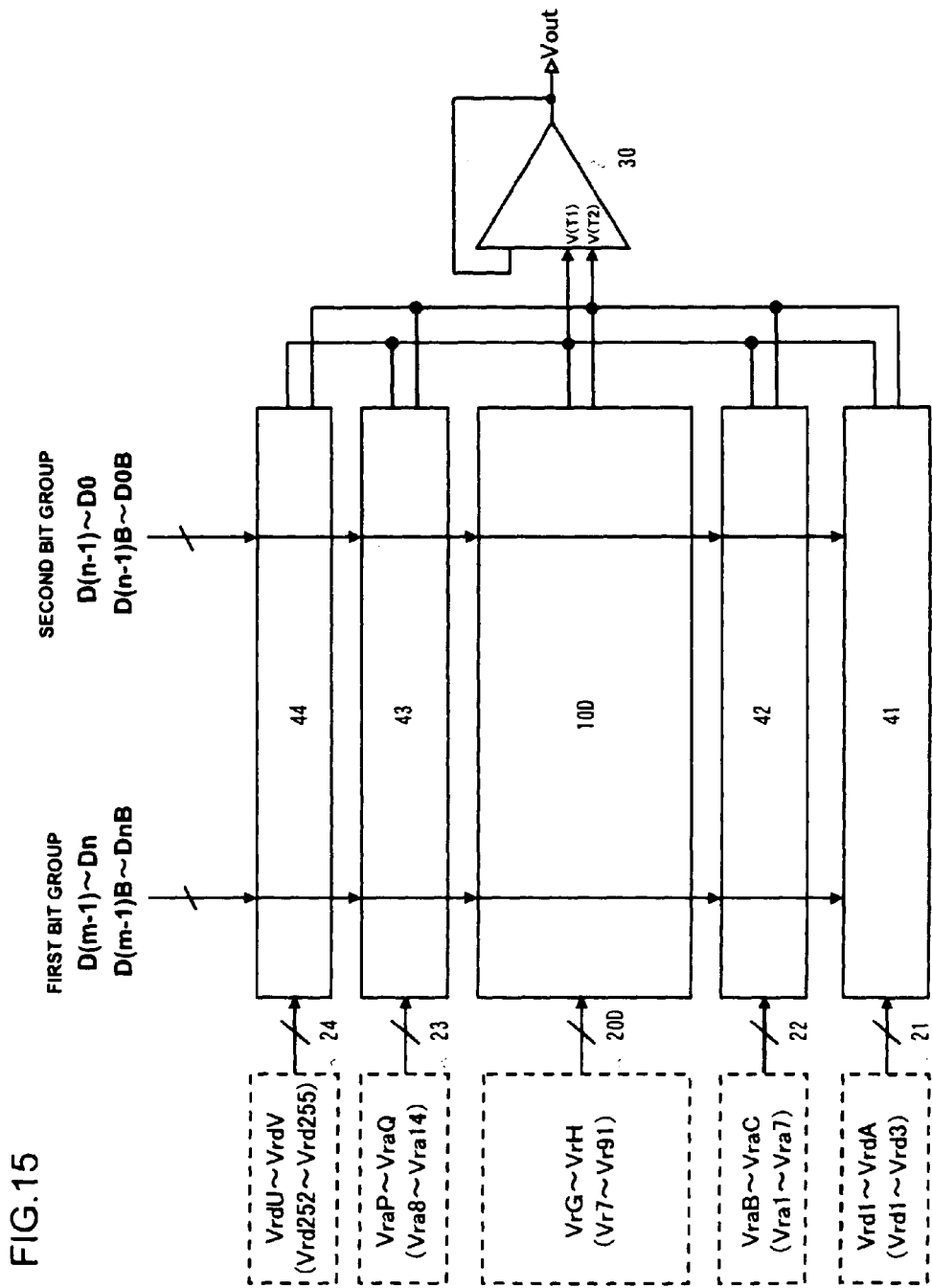
FIG. 15 is a diagram illustrating the configuration of a DAC according to another exemplary embodiment of the present invention.

FIG. 14 is a diagram for describing the specifications of a DAC according to a further exemplary embodiment of the present invention. This is an example in which the decoder of the present invention is applied to specific intervals of grayscale levels. The DAC of this exemplary embodiment has a configuration suitably adapted to an input/output characteristic that conforms to the γ characteristic of a display device. FIG. 15 shows the configuration which is compatible with the specifications of FIG. 14. Referring to FIG. 15, the DAC, which in accordance with m bit digital data (where m is a prescribed positive integer such as 8), selects two voltages V(T1) and V(T2) and outputs a voltage level obtained by interpolating the selected two voltages V(T1) and V(T2), comprises five decoders 41, 42, 10D, 43 and 44 and an interpolation amplifier 30.

The levels, Vref, V(T1), V(T2) and D7 to D0 in FIG. 14 are as described earlier with reference to FIG. 2A. There are also provided reference voltage families 21 (reference voltages Vrd1 to VrdA), 22 (reference voltages VraB to VraC), 20D (reference voltages VrX to VrY), 23 (reference voltages VraP to VraQ), and 24 (reference voltages VrdU to VrdV). The example of the specifications of FIG. 14A will be described in the below. It should be noted that level, Vref, V(T1), V(T2), D7-D0 in FIG. 14 are the same as those that have been described with reference to FIG. 2A.

Referring to FIG. 14, levels 0 to 3 constitute a decoder block (DBLK1) that selects identical voltages as the two voltages [V(T1), V(T2)] applied to the interpolation amplifier. The reference voltages in this block are Vrd0, Vrd1, Vrd2 and Vrd3 in one to one correspondence with levels 0 to 3 of output voltages.

Levels 4 to 15 constitute a decoder block (DBLK2) that selects adjacent reference voltages, inclusive of redundant selection of the same reference voltage, as the two voltages [V(T1), V(T2)] applied to the interpolation amplifier. The reference voltages in this block are Vra1 to Vra7, which correspond to every other level of levels 4 to 15 of output voltages.

Levels 16 to 239 constitute a decoder block (DBLK3) that selects reference voltages, inclusive of redundant selection of the same reference voltage, as the two voltages [V(T1), V(T2)] applied to the interpolation amplifier which corresponds to the decoder in FIG. 1. The reference voltages includes Vr7, Vr8, Vr9, Vr10 to Vr88, Vr89, Vr90 and Vr91 which correspond to the output voltage level 16, 18, 22, 24 to 232, 234, 238, and 240 of FIG. 2A.

Levels 240 to 251 constitute a decoder block (DBLK4) that selects the same or adjacent reference voltages, as the two voltages [V(T1), V(T2)] applied to the interpolation amplifier. The reference voltages in this block are Vra8 to Vra14, which correspond to every other level of levels 240 to 251 of output voltages.

Levels 252 to 255 constitute a decoder block (DBLK5) that selects identical voltages as the two voltages [V(T1), V(T2)] applied to the interpolation amplifier. The reference voltages in this block are Vrd252, Vrd253, Vrd254, and Vrd255 which are in one to one correspondence with levels 252 to 255 of output voltages.

This exemplary embodiment can be implemented by combining different types of decoder blocks and using a common interpolation amplifier.

FIG. 15 is a diagram illustrating an example of the arrangement of decoder blocks in a DAC according to the specifications of FIG. 14. As shown in FIG. 15, the DAC comprises: a decoder 41, which receives the reference voltages Vrd1 to VrdA (Vrd1 to Vrd3) of the reference voltage family 21 of the decoder block (DBLK1) as an input, for selecting any one of Vrd1 to Vrd3 in duplicate as V(T1) and V(T2) based upon the first bit group D(m−1) to Dn and the second bit group D(n−1) to D0;

a subdecoder 42, which receives the reference voltages VraB to VraC (Vra1 to Vra7) of the reference voltage family 22 of the decoder block (DBLK2) as an input, for selecting two identical reference voltages or two adjacent reference voltages as V(T1) and V(T2) based upon the first bit group D(m−1) to Dn and the second bit group D(n−1) to D0;

a subdecoder 10D, which receives the reference voltages VrG to VrH (Vr7 to Vr91) of the reference voltage family 20D of the decoder block (DBLK3) as an input, for selecting two reference voltages, inclusive of redundant selection of the same reference voltage, as V(T1) and V(T2) based upon the first bit group D(m−1) to Dn and the second bit group D(n−1) to D0;

a subdecoder 43, which receives the reference voltages VraP to VraQ (Vra8 to Vra14) of the reference voltage family 23 of the decoder block (DBLK2) as an input, for selecting two identical reference voltages or two adjacent reference voltages as V(T1) and V(T2) based upon the first bit group D(m−1) to Dn and the second bit group D(n−1) to D0;

a subdecoder 44, which receives the reference voltages VrdU to VrdV (Vrd252 to Vrd255) of the reference voltage family 24 of the decoder block (DBLK5) as an input, for selecting any one of Vrd252 to Vrd255 in duplicate as V(T1) and V(T2) based upon the first bit group D(m−1) to Dn and the second bit group D(n−1) to D0; and the interpolation amplifier 30 which receives two voltages selected by any one of the subdecoders 41, 42, 10D, 43, and 44. The outputs of the subdecoders 41, 42, 10D, 43, and 44 are connected in common to the interpolation amplifier 30. This exemplary embodiment can be implemented by combining different decoder blocks and using a common interpolation amplifier 30. The first bit group D(m−1) to Dn and second bit group D(n−1) to D0 are accompanied by complementary signals D(m−1)B to DnB and D(n−1)B to D0B.

The subdecoder 10D corresponds to the decoder of FIG. 1. The arrangements of FIGS. 3 to 8 described above can be applied to That is, reference voltages Vr7 to Vr91 for outputting the voltages of levels 16 to 239 of FIG. 2A are selected as V(T1) and V(T2). The decoder 10D may have the configuration necessary for the selection of the reference voltages Vr7 to Vr91 of FIG. 3, FIG. 4, FIG. 7, FIG. 8, FIG. 10, FIG. 11, and FIG. 23. The subdecoders 13 (13A, 13B), 14, 15 may have the same configuration as those of FIG. 5, FIG. 6 or FIG. 24. The predecoder 16 may have the same configuration as that of FIG. 12 or 13. In the respective subdecoders 11-iA, 11-iB, and 11-iC of FIGS. 4, 8 and 11, however, the switching transistors that select the reference voltages Vr1 to Vr6, Vr92 to Vr97 can be deleted. More specifically, in the subdecoder 11-iA of FIG. 4, switches 191 and 192 may be deleted. The switch 191 selects the reference voltage Vr7 of the reference voltage group 20-7A in the subdecoder 11-7A. However, the Vr7 is included in the reference voltage group 20-1A and hence there is no problem to delete the switch 191. The switch 192 selects the reference voltage Vr91 of the reference voltage group 20-1A in the subdecoder 11-1A. However, the Vr91 is included in the reference voltage group 20-7A and hence there is no problem to delete the switch 192.

Figure 16:
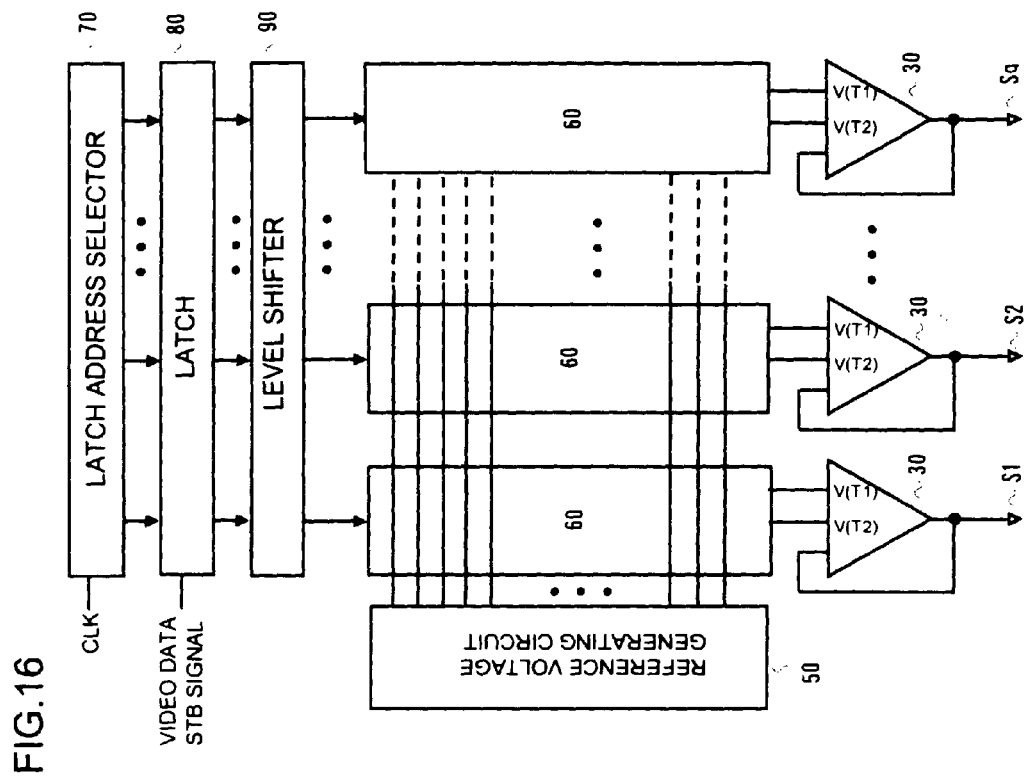
FIG. 16 is a diagram illustrating the configuration of an exemplary embodiment of a data driver according to the present invention.
Figure 17:
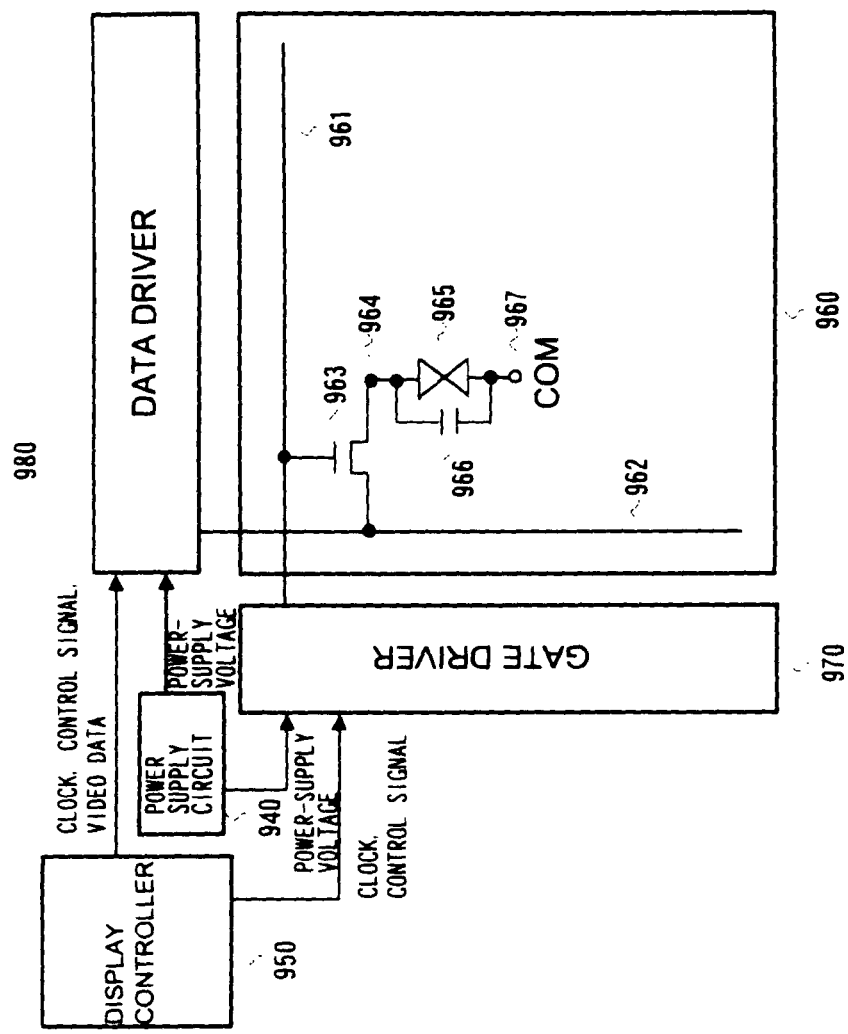
FIG. 17 is a diagram illustrating the configuration of an active-matrix liquid crystal display device.

FIG. 16 is a diagram illustrating the principal portion of the configuration of a data driver in a display device according to another exemplary embodiment of the present invention. As shown in FIG. 16, the data driver comprises a reference voltage generating circuit 50, decoders 60, amplifier circuits (interpolation circuits) 30, a latch address selector 70, a latch 80 and a level shifter 90. The reference voltage generating circuit 50 generates the reference voltages of the reference voltage family 20 of FIG. 1 (FIG. 3, FIG. 7, FIG. 10 and FIG. 24) or the reference voltage families 20D and 21 to 24 of FIG. 15. The decoder 60 includes the decoder 10 of FIG. 1 (FIG. 3, FIG. 7, FIG. 10 and FIG. 24) or the decoder 10D and 41 to 44 of FIG. 15. The amplifier circuit includes the interpolation circuits 30.

The latch address selector 70 decides the timing of the data latch based upon a clock signal CLK. The latch 80 latches video digital data based upon the timing decided by the latch address selector 70 and outputs data to the decoders 60 in unison via the level shifter 90 in accordance with an STB signal (strobe signal). The decoder 60 selects and outputs two voltages V(T1) and V(T2) out of the reference voltages generated by the reference voltage generating circuit 50, in accordance with the input digital data signal. The amplifier circuit 30 outputs a voltage obtained by interpolating the voltages V(T1) and V(T2) with a ratio of 1:1. The output ends (S1, S2, . . . Sq) of the amplifier circuit 30 are connected to data lines of the display device. The latch address selector 70 and latch 80 are logic circuits and generally operate at low voltages (0 to 3.3. V) to which corresponding power supply voltages are provided. The level shifter 90, decoder 60 and amplifier circuit 30 are driven with a high voltage (ex. 0V to 16V) and provided with corresponding power supplies. The DAC according to the present invention may well be applied to the configuration comprising reference voltages generated by the reference voltage generating circuit 50, the decoder 60 and the amplifier circuit 30.

In FIG. 16, in a case where the decoders 60 has the configuration as shown in FIG. 3, which corresponds to the specifications of FIG. 2A, the reference voltage generating circuit 50 generates reference voltages Vr1 to Vr(6h+1). The following first to seventh reference voltage groups:

[Vr1, Vr7, . . . Vr(6h−5)],
[Vr2, Vr8, . . . Vr(6h−4)],
[Vr3, Vr9, . . . Vr(6h−3)],
[Vr4, Vr10, . . . Vr(6h−2)],
[Vr5, Vr11, . . . Vr(6h−1)],
[Vr6, Vr12, . . . Vr(6h)], and
[Vr7, Vr13, . . . Vr(6h+1)], are supplied to respective ones of the first to seventh decoders (11-1A to 11-7A of FIG. 3) of the decoder 60. Two voltages V(T1) and V(T2) that are output from the subdecoder (13A in FIG. 3) of decoder 60 are supplied to the interpolation amplifier 30.

In a case where the decoders 60 has the configuration as shown in FIG. 7, which corresponds to the specifications of FIG. 2A, the reference voltage generating circuit 50 in FIG. 16 generates reference voltages Vr1 to Vr(3h+1) and the following voltages:

[Vr1, Vr4, . . . Vr(3h−2)];
[Vr2, Vr5, . . . Vr(3h−1)];
[Vr3, Vr6, . . . Vr(3h)]; and
[Vr4, Vr7, . . . Vr(3h+1)]

are supplied to respective ones of the first to fourth subdecoders (11-1B to 11-4B in FIG. 7) of the decoder 60. Two voltages V(T1) and V(T2) that are output from the subdecoder (13A in FIG. 7) of decoder 60 are supplied to the interpolation amplifier 30.

In FIG. 16, in a case where the decoders 60 has the configuration as shown in FIG. 15, which corresponds to the specifications of FIG. 14, reference voltages Vrd0 to Vrd3, Vra1 to Vra7, Vrd252 to Vrd255, Vra8 to Vra14 and Vr7 to Vr91 are generated by the reference voltage generating circuit 50. Reference voltages Vrd0 to Vrd3 are supplied to the decoder 41, reference voltages Vra1 to Vra7 are supplied to the decoder 42, reference voltages Vr7 to Vr91 are supplied to the decoder 43 and reference voltages Vrd252 to Vrd255 are supplied to the decoder 44. Two voltages V(T1) and V(T2) that are output from any one of the decoder 10D and the decoders 41 to 44 are supplied to the interpolation amplifier 30.

In accordance with this exemplary embodiment, it is possible to realize a data driver and display device in which it is possible to reduce the number of necessary reference voltages with respect to the number of output levels and to reduce area.

The variations examples of the above described embodiments will now be described.

The variation example of the specifications of FIG. 2A will be described. FIG. 25 is a diagram showing the variation of the specifications of FIG. 2A. While in the specifications of FIG. 2A, reference voltages (Vr1 to Vr97) each are set in correspondence with even output levels of level 0 to level 254, in the specifications of FIG. 25, reference voltages (Vr1 to Vr97) each correspond to output levels, each of which is down-shifted by one level as compared with a corresponding output level of FIG. 2A. More specifically, Vr1 is set to a preceding level of level 0, and Vr2 to Vr97 are set to odd output levels of level 1 to level 253.

Figure 27:
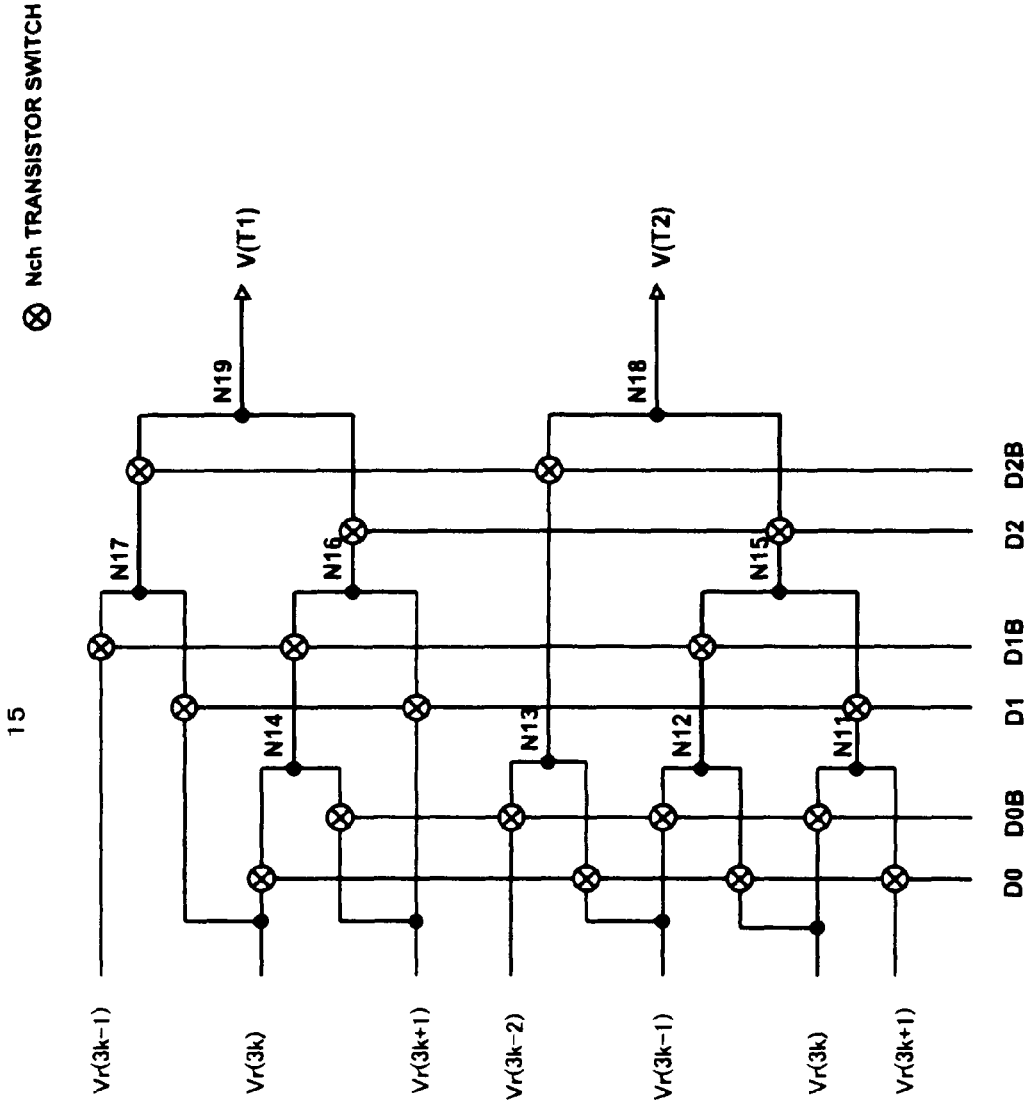
FIG. 27 is a diagram illustrating a modification of the sundecoder of FIG. 6.

In the specifications of FIG. 25, while the correspondence between the respective data of the lower 3 bits (D2 to D0) and the reference voltages, which determines the combinations of V(T1) and V(T2) of one section (8 levels) is changed, the correspondence between respective data of the upper 5 bits (D7 to D3), and the reference voltages, which determines the combinations of four reference voltages on each section is kept the same as that of FIG. 2A. The configuration of the subdecoder 15 included in the subdecoders 13, 13A, 13B, and 13C in FIG. 1, FIG. 3, FIG. 7 and FIG. 10 is changed. FIG. 27 shows the configuration of the variation (subdecoder 15') of the subdecoder 15 of FIG. 6, which corresponds to the specifications of FIG. 25.

Referring to FIG. 27, in the subdecoder 15', N-channel transistor switches which are connected to (D0, D0B), select ones of [Vr(3k+1), Vr(3k)], [Vr(3k), Vr(3k−1)], and [Vr(3k−1), Vr(3k−2)] and deliver selected ones to node N11, N12 and N13, respectively. Another N-channel transistor switches which are connected to (D0, D0B), select one of [Vr(3k), Vr(3k+1)] and deliver selected one to node N14.

N-channel transistor switches which are connected to (D1, D1B), select ones of nodes N11 and N12 and deliver selected one to node N15, select one of Vr(3k+1) and node N14 and deliver selected one to node N16 and select one of Vr(3k) and Vr(3k−1) and deliver selected one to node N17.

N-channel transistor switches which are connected to (D2, D2B), select ones of nodes N15 and N13 and deliver selected one to node N18. The voltage of the node N18 provides V(T2). Another N-channel transistor switches which are connected to (D2, D2B), select ones of nodes N16 and N17 and provides V(T1).

For example, in case of k=1 (the upper 4 bits (D7,D6,D5,D4)=(0,0,0,0)), (Vr1, Vr2, Vr3, Vr4) is entered as [Vr(3k−2), Vr(3k−1), Vr(3k), Vr(3k+1)] to the subdecoder 15 of FIG. 27, the following holds:

[V(T1), V(T2)]=(Vr2, Vr1), if (D2,D1,D0)=(0,0,0);
[V(T1), V(T2)]=(Vr2, Vr2), if (D2,D1,D0)=(0,0,1);
[V(T1), V(T2)]=(Vr3, Vr1), if (D2,D1,D0)=(0,1,0);
[V(T1), V(T2)]=(Vr3, Vr2), if (D2,D1,D0)=(0,1,1);
[V(T1), V(T2)]=(Vr4, Vr2), if (D2,D1,D0)=(1,0,0);
[V(T1), V(T2)]=(Vr3, Vr3), if (D2,D1,D0)=(1,0,1);
[V(T1), V(T2)]=(Vr4, Vr3), if (D2,D1,D0)=(1,1,0); and
[V(T1), V(T2)]=(Vr4, Vr4), if (D2,D1,D0)=(1,1,1).

Two reference voltages for producing level 0 to 7 in FIG. 25 are provided to V(T1) and V(T2).

Figure 26:
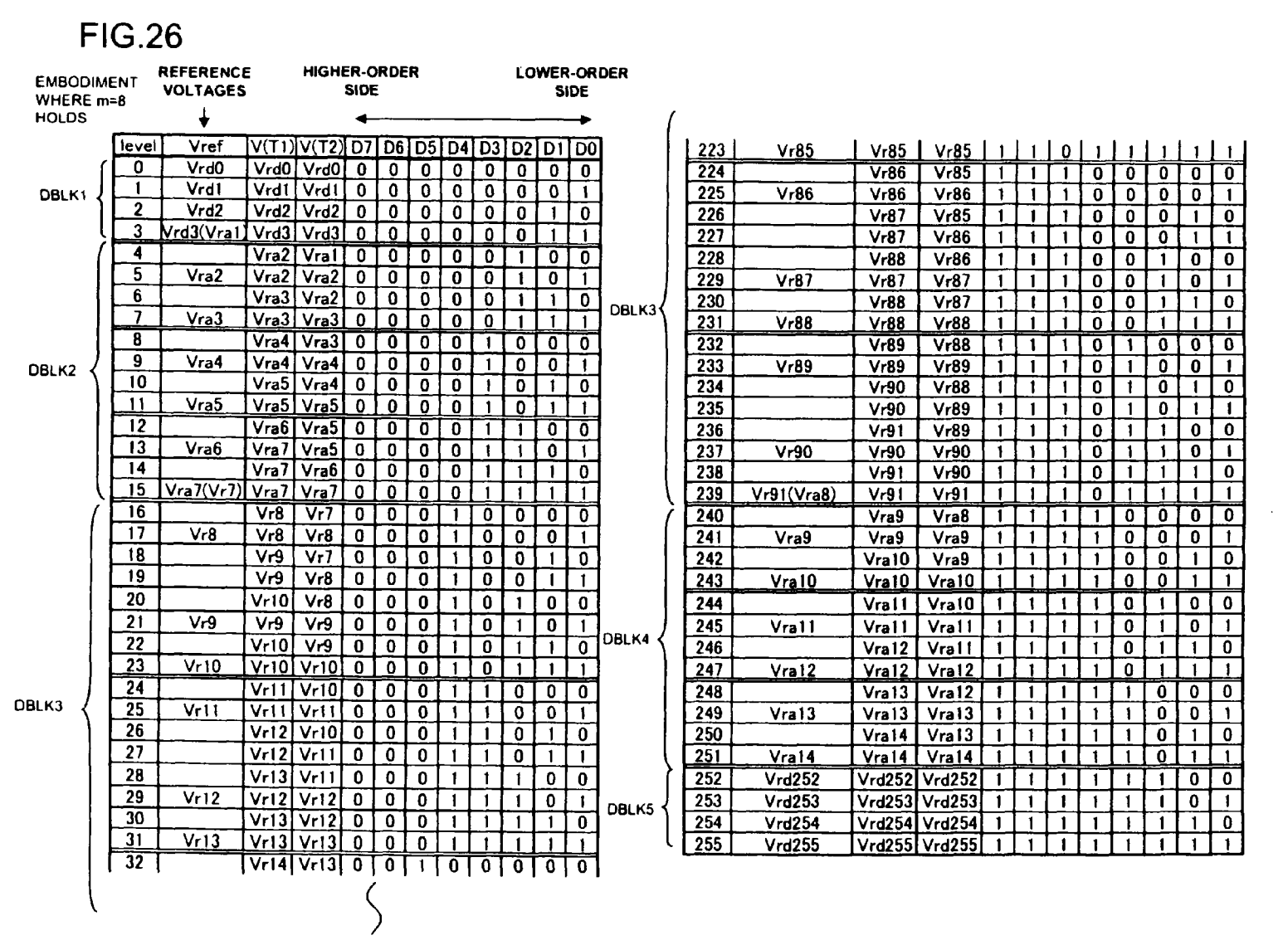

The variation example of the specifications of FIG. 14 will now be described. In the specifications of FIG. 14, reference voltages Vra1 to Vra7, Vr7 to Vr91, Vra8 to Vra14 are set in correspondence with even output levels of level 4 to level 252. In the specifications of FIG. 26, each reference voltage corresponds to an output level down-shifted by one level as compared with a corresponding output level of FIG. 14. More specifically, reference voltages are set in correspondence with odd output levels of level 3 to level 251.

In the specifications of FIG. 26, as with the specifications of FIG. 25, in the data block DBLK3 (decoder 10D of FIG. 15), while the correspondence between respective data of the lower 3 bits (D2 to D0) of the second bit group and reference voltages is changed from that of FIG. 14, the correspondence between respective data of the upper 5 bits (D7 to D4) and reference voltages is kept the same as that of FIG. 14. Therefore, the configuration of the decoder 10D of FIG. 15 which corresponds to the specifications of FIG. 26, the subdecoder 15 (FIG. 6) included in the decoder 10D is changed. As the subdecoder 15 of FIG. 6 which corresponds to the specifications of FIG. 26, a subdecoder of FIG. 27 can be used.

In the decoder blocks DBLK2 and DBLK4 (Decoders 42 and 43 of FIG. 15), while the correspondence between respective data of the lower 2 bits (D1, D0) of the second bit group and reference voltages is changed from that of FIG. 14. Therefore, in the configuration of the decoder 42 and 43 of FIG. 15 which corresponds to the specifications of FIG. 26, the configuration of a subdecoder (not shown) is changed.

Next, the grouping of the reference voltage family 20 will be described.

FIG. 28 is a diagram showing in detail the example of the grouping of the reference voltage family 20. Referring to FIG. 28, the grouping of reference voltages [(3hS+1) at maximum] in the reference voltage family 20 may be represented by a two dimension array having (3S+1) rows and h columns with respect to the first to (3S+1)th reference voltage groups (20-1 to 20-(S+1) of FIG. 1) and the order of the reference voltage in the reference voltage group to which the reference voltage belongs. The element of i-th row and j-th column in the two dimension array (where i is any integer greater than or equal to 1 and less than or equal to (3S+1), and j is any integer greater than or equal to 1 and less than or equal to h) corresponds the reference voltage Vr[(3S)×(h−1)+i].

More specifically, the first reference voltage group 20-1 includes reference voltages Vr1, Vr(3S+1), Vr(6S+1), . . . and Vr[(3S)×(h−1)+1] which are extracted at intervals of (3S) from the elements in the first row of the two dimension array.

The i-th reference voltage group 20-i (where 1≦i≦(S+1)) includes reference voltages Vr(i), Vr(3S+i), Vr(6S+i), . . . and Vr[(3S)×(h−1)+i] which are extracted at intervals of (3S) from the elements in the i-th row of the two dimension array.

The (3S+1)th reference voltage group 20-(3S+1) includes reference voltages Vr(3S+1), Vr(6S+1), Vr(9S+1), . . . and Vr(3hS+1) which are extracted at intervals of (3S) from the elements in the (3S+1)th row of the two dimension array.

The second reference voltage Vr(3S+1) in the first reference voltage group 20-1 is identical to the first reference voltage Vr(3S+1) in the (3S+1)th reference voltage group 20-(3S+1). The reference voltage allocated to the first row and j'-th column (where j is an integer greater than or equal to 2 and less than equal to h) of the two dimension array, and belonging to the first reference voltage group 20-1, and the reference voltage allocated to the (3S+1)th row and (j'−1)th column of the two dimension array and belonging to the first reference voltage group 20-(3S+1) are identical.

The column of the two dimension array of FIG. 28 corresponds to the value of the first bit group [D(m−1) to Dn, D(m−1)B to DnB] in FIG. 1. The reference voltages selected by the first to (3S+1) subdecoders 11-1 to 11-(3S+1) in FIG. 1 are (3S+1) items of reference voltages allocated to any one of the first to h-th columns of the two dimension array of FIG. 28, corresponding to the value of the first bit group.

FIGS. 29A and 29B show specific examples of the grouping of the reference voltages Vr1 to Vr97 shown in FIG. 2A or FIG. 25.

FIG. 29A shows an example in case of S=1 and h=32. This example corresponds to the reference voltage groups 20-1B to 20-4B in FIG. 7 and to the reference voltage groups 20-1C to 20-4C in FIG. 10. The reference voltages selected by the subdecoders 11-1B to 11-4B in FIG. 7 are four reference voltages allocated to any one of columns of the two dimension array with 4-rows and 32-columns shown in FIG. 29A, corresponding to the first bit group (D7 to D3, D7B to D3B).

FIG. 29B shows an example in case of S=2 and h=16. This example corresponds to the reference voltage groups 20-1A to 20-7A in FIGS. 3 and 23. The reference voltages selected by the subdecoders 11-1A to 11-7A in FIGS. 3 and 23 are seven reference voltages allocated to any one of columns of the two dimension array with 7-rows and 16-columns shown in FIG. 29B, corresponding to the first bit group (D7 to D4, D7B to D4B).

The grouping of the reference voltage family 20D in FIG. 15 will now be described in detail. FIGS. 30A and 30B show detailed examples of the grouping of the reference voltage family 20D in FIG. 15. This example corresponds to a case in which in the grouping of the reference voltage family 20, the total number of the reference voltages is less than (3S)×h+1 which is the total number of the reference voltages shown in FIG. 28.

Referring to FIGS. 30A and 30B, the reference voltages VrG to VrH of the reference voltage family 20D in FIG. 15, correspond to reference voltages Vr[(3S)×(p−1)+X] to Vr[(3S)×(q−1)+Y] where 1≦X≦3S, and 2≦Y≦(3S+1) and are grouped into the first to (3S+1) reference voltage groups not shown, which correspond to the reference voltage groups 20-1 to 20-(3S+1) in FIG. 1. More specifically, relating to the reference voltage Vr[(3S)×(p−1)+X] to Vr[(3S)×(q−1)+Y], as with FIG. 28, the reference voltages Vr[(3S)×(p−1)+X] to Vr[(3S)×p+1] are allocated to elements of X-th to (3S+1)th rows of p-th column where 1≦p≦(h−1), of the two dimension array of (3S+1) rows and h columns, the reference voltages Vr[(3S)×p+1] to Vr[(3S)×(q−1)+1], where 3≦q≦h, are allocated to elements of the first to (3S+1) rows of (p+1)th to (q−1)th columns of the two dimension array, and the reference voltages Vr[(3S)×(q−1)+1] to Vr[(3S)×(q−1)+Y] are allocated to elements of the first to Y columns of the q-th column of the two dimension array.

In FIGS. 30A and 30B, the reference voltage allocated to the first row and j'-th column of the two dimension array, where (p+1)≦j'≦q is identical to the reference voltage allocated to the (3S+1)th row and (j'−1)th column of the two dimension array. Reference voltages Vr1 to Vr[(3S)×(p−1)+X−1] and Vr[(3S)×(q−1)+Y+1] to Vr((3S)×h+1) are eliminated.

In FIGS. 30A and 30B, there is a difference in the order of reference voltages X and Y. That is, X≦Y holds in FIG. 30A, while X≧Y holds in FIG. 30B.

The columns in the two dimension array in FIGS. 30A and 30B correspond to values of the first bit group (D(m−1) to Dn, D(m−1)B to DnB). The reference voltages selected by the first to (3S+1)th subdecoders not shown (corresponding to subdecoders 11-1 to 11-(3S+1)) in FIG. 1 provided in the decoder 10D in FIG. 15, are (3S+1) or less reference voltages allocated to any one of p-th to q-th columns of FIG. 30A or FIG. 30B corresponding to the first bit group.

FIGS. 31A, 31B and 31C show specific examples of the grouping of the reference voltages Vr7 to Vr91 corresponding to DBLK3 compatible with the specifications of FIG. 14 or FIG. 26.

FIG. 31A shows an example in case of S=1 and h=32. The reference voltages selected by the first to (3S+1)th subdecoders (corresponding to subdecoders 11-1 to 11-(3S+1) in FIG. 1) are seven reference voltages allocated to any one of the 3rd (p=3, X=1) to 30th (q=30, Y=4) columns of the two dimension array with 4-rows and 32-columns shown in FIG. 31A, corresponding to values of the first bit group (D7 to D3, D7B to D3B).

FIG. 31B shows an example in case of S=2 and h=16. The reference voltages selected by the first to (3S+1)th subdecoders (corresponding to subdecoders 11-1 to 11-(3S+1) in FIG. 1) are seven reference voltages allocated to any one of the 2nd (p=2, X=1) to 15th (q=15, Y=7) columns of the two dimension array with 7-rows and 16-columns shown in FIG. 31B, corresponding to values of the first bit group (D7 to D4, D7B to D4B).

FIG. 31C shows an example in case of S=4 and h=8. The reference voltages selected by the first to (3S+1)th subdecoders (corresponding to subdecoders 11-1 to 11-(3S+1) in FIG. 1) are allocated to any one of the 1st (p=1, X=7) to 8th (q=8, Y=7) columns of the two dimension array with 13-rows and 8-columns shown in FIG. 31C, corresponding to values of the first bit group (D7 to D5, D7B to D5B). When the value of the first bit group (D7 to D5, D7B to D5B) corresponds to the first or eighth column, seven reference voltages are selected and output by seven subdecoders out of the first to (3S+1)th subdecoders and remaining six subdecoders are set to be in a non-selection state. When the value of the first bit group (D7 to D5, D7B to D5B) corresponds to any one of the second to seven columns, thirteen reference voltages are selected and output by the first to (3S+1)th subdecoders. As shown in FIGS. 31A, 31B and 31C, indices X, Y, p differ in values in accordance with the range of output levels allocated to DBLK3 and setting values of S and h.

It should be noted that the disclosures of each of the aforementioned patent documents are herewith incorporated by reference in their entirety. Though the present invention has been described in accordance with the foregoing exemplary embodiments, the invention is not limited to these exemplary embodiments and it goes without saying that the invention covers various modifications and changes that would be obvious to those skilled in the art within the scope of the claims.

What is claimed is:

1. A digital-to-analog converting circuit comprising:
   a decoder selecting, responsive to an input digital signal, first and second voltages out of a reference voltage family including a plurality of reference voltages that differ from one another; and
   an interpolation circuit receiving the first and second voltages selected by the decoder and producing a voltage level obtained by interpolating the first and second voltages with a predetermined interpolate ratio;
   the plurality of reference voltages of the reference voltage family being grouped into first to (3S+1)th reference voltage groups, where S is one or a prescribed positive integer of a power of 2,
   an i-th reference voltage group, where i is an any one of 1 to (3S+1), including [3S×(j−1)+i]th reference voltages, where j=1, 2, ..., h, h being a prescribed positive integer,
   the decoder including:
   first to (3S+1)th subdecoders provided respectively in correspondence with the first to (3S+1)th reference voltage groups, each of subdecoders being able to select one reference voltage out of the plurality of reference voltages of the corresponding reference voltage group in accordance with values of a first bit group of the input digital signal; and
   a (3S+1)-input and 2-output subdecoder selecting the first and second voltages out of reference voltages selected by the first to (3S+1)th subdecoders, in accordance with values of a second bit group of the input digital signal.

2. The circuit according to claim 1, wherein the interpolate ratio of the interpolation circuit is set to 1:1, and
   respective reference voltages of the reference voltage family correspond to a plurality of output voltage levels output from the interpolation circuit and include (3N'+1) reference voltage which are allocated, with regard to A-th output voltage level, (8N+A)th output voltage level, (8N+A+2)th output voltage level, (8N+A+6)th output voltage level, and (8N'+A)th output voltage level, where N=0, 1, 2, . . . (N'−1), and N' being a prescribed integer more than 1.

3. The circuit according to claim 2, wherein N' is S×h and the reference voltage family includes (3S×h+1) reference voltages.

4. The circuit according to claim 1, wherein S is an integer greater than or equal to 2 and the second bit group is composed by lower order n bits of the input digital signal, where n is an integer greater than or equal to 4 and the lower order n bits exceed 3 bits,
   the (3S+1)-input and 2-output subdecoder including:
   a preceding-stage subdecoder selecting four reference voltages out of the reference voltages selected by the first to (3S+1)th subdecoders, based upon higher order (n−3) bits, which is the amount by which 3 bits is exceeded, of the second bit group; and
   a succeeding-stage subdecoder selecting the first and second reference voltages out of the four reference voltages selected by the preceding-stage subdecoder, in accordance with lower order 3 bits of the second bit group.

5. The circuit according to claim 1, wherein S is one and the second bit group is composed by lower order 3 bits of the input digital signal, the (3S+1)-input and 2-output subdecoder selecting and outputting the first and second voltages out of four reference voltages, selected by the first to fourth subdecoders, in accordance with the second bit group.

6. The circuit according to claim 1, wherein the reference voltages selected by the first to (3S+1)th subdecoders are made voltages which are continuous in order in the reference voltage family.

7. The circuit according to claim 1, wherein a plurality of output voltage levels produced by the interpolation circuits, include a plurality of blocks in which one block has eight adjacent levels,
   one block out of the plurality of the blocks is selected by the first bit group of the input digital signal and bits that exceed the lower three bits of the second bit group of the input digital signal, and
   in relation to first to eighth levels spaced apart from one another in unit steps and constituting the one block, the decoder selects any one of the following pairs as the first and second voltages, in correspondence with first, second and third reference voltages corresponding respectively to first, third and seventh levels and a fourth reference voltage corresponding to a first level of an other block neighboring to the one block on the side of the eight level of the one block, based upon the lower three bits of the second bit group:
   (1) the first reference voltage and the first reference voltage;
   (2) the first and second reference voltages;
   (3) the second reference voltage and the second reference voltage;
   (4) the first and third reference voltages;
   (5) the second and third reference voltages or the first and fourth reference voltages;
   (6) the second and fourth reference voltages;
   (7) the third reference voltage and the third reference voltage; and
   (8) the third and fourth reference voltages;
   and supplies the selected reference voltages to the interpolation circuit as the first and second voltages.

8. The circuit according to claim 1, wherein a plurality of output voltage levels produced by the interpolation circuits, include a plurality of blocks in which one block has eight adjacent levels, one block out of the plurality of the blocks is selected by the first bit group of the input digital signal and bits that exceed the lower three bits of the second bit group of the input digital signal; and in relation to first to eighth levels spaced apart from one another in unit steps and constituting the one block, the decoder selects any one of the following pairs as the first and second voltages, in correspondence with second, third and fourth reference voltages corresponding respectively to second, sixth and eighth levels and a first reference voltage corresponding to an eighth level of an other block neighboring to the one block on the side of the first level of the one block, based upon the lower three bits of the second bit group:

(1) the first and second reference voltage;
(2) the second reference voltage and the second reference voltage;
(3) the first and third reference voltage;
(4) the second and third reference voltages or the first and fourth reference voltages;
(5) the second and fourth reference voltages;
(6) the third reference voltage and the third reference voltage;
(7) the third and fourth reference voltages; and
(8) the fourth reference voltage and the fourth reference voltage;

and supplies the selected reference voltages to the interpolation circuit as the first and second voltages.

9. The circuit according to claim 1, further comprising
a predecoder receiving as an input and decoding a prescribed bit field of the first bit group of the input digital signal,
a signal decoded by the predecoder and a bit signal of the first bit group, with the exception of the prescribed bit field, being supplied to the first to (3S+1)th subdecoders.

10. The circuit according to claim 1, wherein the interpolation circuit comprises
an amplifier circuit producing a voltage obtained by interpolating the first and second voltages with an interpolation ratio 1:1.

11. The circuit according to claim 10, wherein when the decoder selects and outputs the same reference voltage as the first and second voltages, the amplifier circuit outputs a voltage identical with the same reference voltages.

12. The circuit according to claim 1, wherein the circuit has at least one separate reference voltage family that includes a plurality of reference voltages having a range different from a range of output levels defined by the first to (3S+1)th reference voltage groups, and further comprises a separate decoder receiving the reference voltages of the separate reference voltage family as inputs and selecting third and fourth voltages in accordance with the input digital signal,
the separate decoder having an output coupled with the output of the decoder,
the interpolation circuit producing a voltage level obtained by interpolating the third and fourth voltages with the predetermined interpolation ratio.

13. The circuit according to claim 12, wherein the separate reference voltage family includes reference voltages corresponding to output levels over a voltage range on an upper side and/or lower side of the voltage range of the output voltage levels defined by the first to (3S+1)th reference voltage groups, the separate reference voltage family includes reference voltages corresponding by one to one to respective ones of the output voltage levels, and the separate decoder corresponding to the separate reference voltage family selects identical reference voltages in accordance with the input digital signal and outputs selected reference voltages as the third and fourth voltages.

14. The circuit according to claim 12, wherein the separate reference voltage family includes reference voltages corresponding to output levels over a voltage range on an upper side and/or lower side of the voltage range of the output voltage levels defined by the first to (3S+1)th reference voltage groups, the separate reference voltage family includes reference voltages corresponding to every other levels of the output levels, and the separate decoder corresponding to the separate reference voltage family selects identical reference voltages or neighboring reference voltages in accordance with the input digital signal and outputs the selected reference voltages as the third and fourth voltages.

15. The circuit according to claim 1, wherein the first to (3S+1)th reference voltage groups are first to seventh reference voltage groups, assuming that S=2 holds, and an ith reference voltage group (where i is 1 to 7) includes $[6\times(j-1)+i]$th reference voltages, where $j=1, 2, \ldots h$, and h is a prescribed integer, first to seventh subdecoders are provided as the first to (3S+1)th subdecoders, the fourth subdecoder is placed adjacent to both of the first and seventh subdecoders, the second and fifth subdecoders are placed adjacent to each other, and the third and sixth subdecoders are placed adjacent to each other, and a 7-input and 2-output subdecoder is provided as the (3S+1)-input and 2-output subdecoder for selecting the first and second voltages, inclusive of redundant selection of the same reference voltage, out of the reference voltages selected by the first to seventh subdecoders, in accordance with values of a second bit group on a lower order side of the input digital signal, and outputting the selected reference voltages as first and second voltages.

16. The circuit according to claim 1, wherein the reference voltages of the reference voltage family are grouped into the first to (3S+1)th reference voltage groups, in such a manner that the $[(3S)\times(j-1)+i]$th reference voltage of the i-th reference voltage group corresponds to i-th row and j-th column array element, where i is any integer greater than or equal to 1 and less than or equal to (3S+1), and j is any integer greater than or equal to 1 and less than or equal to h, in a two dimension array having (3S+1) rows and h columns where h is a prescribed integer greater than or equal to 2, the first to (3S+1)th reference voltage groups being allocated in the rows of the two dimension array, the order of respective reference voltages in the reference voltage group to which the respective reference voltages belong being allocated to the columns of the two dimension array.

17. The circuit according to claim 16, wherein the first to (3S+1)th reference voltage groups each include reference voltages corresponding to the first to h-th columns in the first to (3S+1)th rows of the two dimension array.

18. The circuit according to claim 16, wherein the first to (3S+1)th reference voltage groups include (p+1)th to (q−1)th columns, where p is any integer greater than or equal to 1 and less than or equal to (h−1), and q is any integer greater than or equal to 3 and less than or equal to h, X-th to (3S+1)th reference voltage groups, where X is an integer greater than or equal to 1 and less than (3S+1), out of the first to (3S+1)th reference voltage groups, include reference voltages corresponding to p-th column in Xth to (3S+1)th rows of the two dimension array, and first to Yth reference voltage groups, where Y is any integer greater than 1 and less than or equal to (3S+1), out of the first to (3S+1)th reference voltage groups, include reference voltages corresponding to q-th column in the first to Yth rows of the two dimension array.

19. The circuit according to claim 16, wherein the first to (3S+1)th sundecoders each receive the first bit group of upper (m−n) bits of the input digital data of m bits, where m is a predetermined positive integer and m>n, and select reference voltages allocated to a column of the two dimension array, corresponding to the value of the first bit group,
    reference voltages, the number of which is less than or equal to (3S+1) being output from the first to (3S+1)th sundecoders,
    the (3S+1)-inputs and 2-outputs sundecoder selecting and outputting the first and second voltages out of the reference voltages selected by the first and (3S+1) sundecoders in accordance with the second bit group which is the lower n bits of the m bit digital data.

20. The circuit according to claim 19, wherein the first to (3S+1)th sundecoders each decode the upper (m−n) bits successively from lower side bits to upper side bits.

21. A data driver having the digital-to-analog converting circuit as set forth in claim 1, the digital-to-analog converting circuit receiving an input digital signal conforming to an input video signal and outputting a voltage conforming to the input digital signal.

22. A display device having unit pixels, each of which includes a pixel switch and a display element, provided at intersections of data lines and scanning lines, wherein signals on the data lines are written to the display elements via pixel switches that have been turned on by the scanning lines;
    the display device having the data driver as set forth in claim 21, as a data driver for driving the data lines.

23. A display device comprising:
    a plurality of data lines extending in parallel with one another along a first direction;
    a plurality of scanning lines extending in parallel with one another in a direction perpendicular to the first direction;
    a plurality of pixel electrodes arranged in matrix form at intersections of the plurality of data lines and the plurality of scanning lines;
    a plurality of transistors corresponding to respective ones of the plurality of pixel electrodes, each transistor having a drain and a source one of which is connected to the corresponding pixel electrode and the other of which is connected to a corresponding data line, and a gate connected to a corresponding scanning line;
    a gate driver for supplying scanning signals to respective ones of the plurality of scanning lines; and
    a data driver for supplying gray-scale level signals, which correspond to input data, to respective ones of the plurality of data lines;
    the data driver comprising the data driver as set forth in claim 21.

* * * * *